US012777575B1

(12) United States Patent
Keller, III et al.

(10) Patent No.: US 12,777,575 B1
(45) Date of Patent: Oct. 27, 2026

(54) ELECTRONIC DEVICE AND METHODS TO CUSTOMIZE ELECTRONIC DEVICE ELECTROMAGNETIC EMISSIONS

(71) Applicant: NOKOMIS, INC., Canonsburg, PA (US)

(72) Inventors: Walter J. Keller, III, Bridgeville, PA (US); Alexander William Keller, Bridgeville, PA (US); Andrew Richard Portune, Oakdale, PA (US); Todd Eric Chornenky, Carmichaels, PA (US)

(73) Assignee: NOKOMIS, INC.

( * ) Notice: Subject to any disclaimer, the term of this patent is extended or adjusted under 35 U.S.C. 154(b) by 1167 days.

(21) Appl. No.: 17/544,697

(22) Filed: Dec. 7, 2021

Related U.S. Application Data

(63) Continuation of application No. 15/400,565, filed on Jan. 6, 2017, now abandoned.

(60) Provisional application No. 62/387,820, filed on Jan. 6, 2016.

(51) Int. Cl.
*H05K 1/02* (2006.01)
*G06F 30/39* (2020.01)

(52) U.S. Cl.
CPC ........... *H05K 1/0228* (2013.01); *G06F 30/39* (2020.01); *H05K 2201/09209* (2013.01)

(58) Field of Classification Search
CPC ........ H05K 1/0228; H05K 2201/09209; G06F 30/39
See application file for complete search history.

(56) References Cited

U.S. PATENT DOCUMENTS

| | | | | | |
|---|---|---|---|---|---|
| 3,662,294 | A * | 5/1972 | Jacobs | H03H 7/383 | 333/202 |
| 3,721,919 | A * | 3/1973 | Grace | H03B 9/147 | 333/204 |
| 5,023,866 | A * | 6/1991 | De Muro | H01P 1/2056 | 370/290 |
| 5,212,815 | A * | 5/1993 | Schumacher | H01P 5/185 | 333/204 |
| 7,953,225 | B2 * | 5/2011 | Palum | G06F 21/572 | 713/181 |
| 8,159,347 | B2 * | 4/2012 | Potyrailo | G01N 33/0075 | 340/572.1 |
| 2003/0083839 | A1 * | 5/2003 | Boswell | G01R 31/002 | 702/117 |
| 2004/0028123 | A1 * | 2/2004 | Sugar | H04L 1/1664 | 375/224 |
| 2004/0066273 | A1 * | 4/2004 | Cortina | G06Q 20/32 | 235/475 |
| 2008/0079535 | A1 * | 4/2008 | Tseng | G06F 21/33 | 340/572.1 |

(Continued)

*Primary Examiner* — Nha T Nguyen
(74) *Attorney, Agent, or Firm* — AP Patents; Alexander Pokot

(57) ABSTRACT

A semiconductor device comprises a semiconductor substrate, one or more circuits disposed on the semiconductor substrate, and a modification of any one of hardware, software or firmware of the electronic device that generates emission of electromagnetic energy from the semiconductor device with desired characteristic(s), without changing a designed interface functionality of the semiconductor device. Method are also provided for modifying the semiconductor device and identifying modified semiconductor device.

24 Claims, 19 Drawing Sheets

(56) References Cited

U.S. PATENT DOCUMENTS

| | | | | |
|---|---|---|---|---|
| 2009/0167502 | A1* | 7/2009 | Erickson | G06K 7/0008 340/572.1 |
| 2012/0223403 | A1* | 9/2012 | Keller, III | G06F 21/44 257/428 |
| 2014/0271365 | A1* | 9/2014 | Pathak | C12Q 1/6825 422/69 |
| 2015/0349958 | A1* | 12/2015 | Lindell | G06F 21/31 713/168 |
| 2016/0048712 | A1* | 2/2016 | Butler | G06K 7/10198 340/10.51 |
| 2017/0270323 | A1* | 9/2017 | Butler | G06K 19/07749 |
| 2019/0036706 | A1* | 1/2019 | Detert | G06K 19/07 |
| 2020/0104547 | A1* | 4/2020 | Vermunt | G06Q 10/08 |

* cited by examiner

900

```
.
.
.
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
mov BYTE PTR [ebx], 15; Move 15 into the byte at addr stored in EBX
mov BYTE PTR [ebx], 0 ; Move  0 into the byte at addr stored in EBX
.
.
.
```

(best to turn assembler optimizations OFF when assembling this code, depending on level of assembler sophistication)

Fig. 9

1002
```
genchain:
for i in 1 to 30 generate
chain(i) <= chain(i-1);
end generate;
chain(0) <= not chain(30) or reset;
```
Fig. 10A
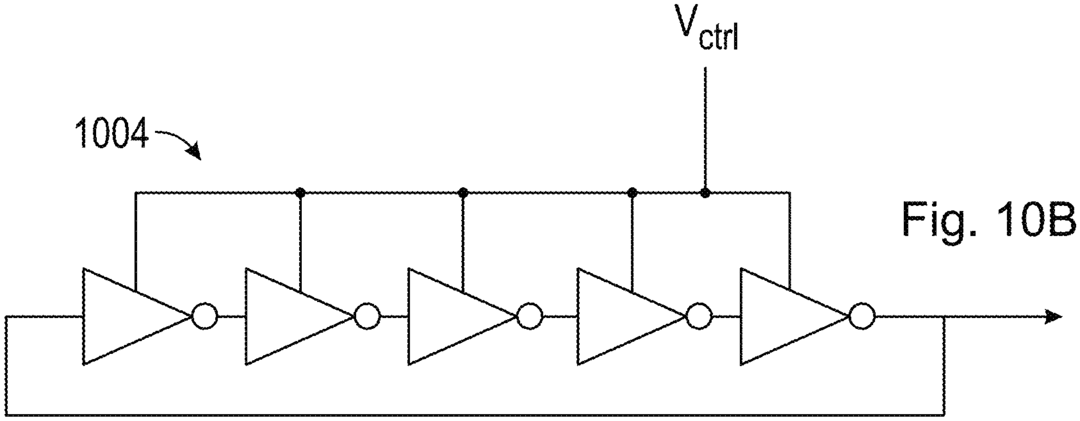
Fig. 10B
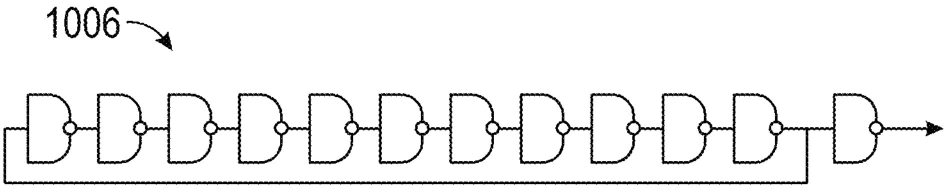
Fig. 10C
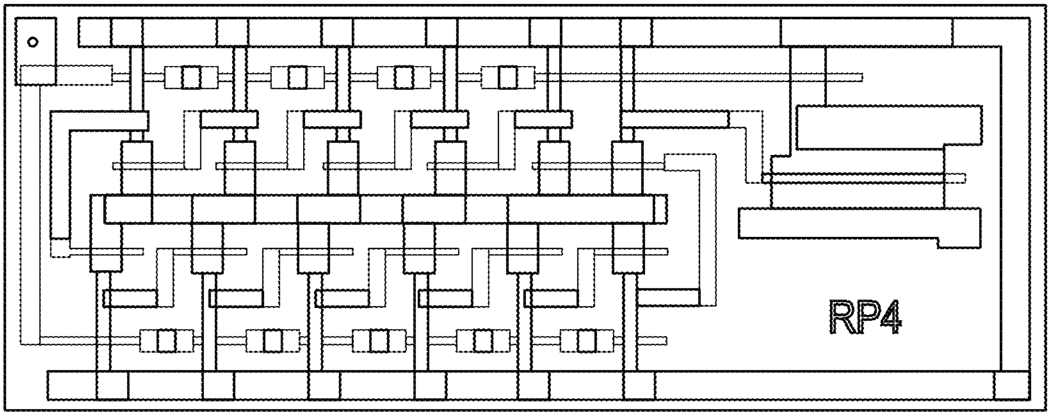
Fig. 10D

1102

2320A

| A | B | (A*B) AND | ~(A*B)= C |
|---|---|---|---|
| 0 | 0 | 0 | 1 |
| 0 | 1 | 0 | 1 |
| 1 | 0 | 0 | 1 |
| 1 | 1 | 1 | 0 |

2320B

2502A

| A | B | ~A | ~B | ~A + ~B = C |
|---|---|---|---|---|
| 0 | 0 | 1 | 1 | 1 |
| 0 | 1 | 1 | 0 | 1 |
| 1 | 0 | 0 | 1 | 1 |
| 1 | 1 | 0 | 0 | 0 |

2502B

ELECTRONIC DEVICE AND METHODS TO CUSTOMIZE ELECTRONIC DEVICE ELECTROMAGNETIC EMISSIONS

CROSS-REFERENCE TO RELATED APPLICATIONS

The present application is related to and claims priority from provisional US patent application number 62/387,820, titled "Harnessed-unintended Emissions Generation, Detection, and Utilization" and filed Jan. 6, 2016 by inventors Walter John Keller, Alexander William Keller, Andrew Richard Portune and Todd Eric Chornenky, the entire contents of which are hereby incorporated by reference thereto.

This document incorporates by reference the entire contents of disclosures and/or teachings of the following documents: U.S. Pat. No. 7,515,094 entitled "Advanced electromagnetic location of electronic equipment"; U.S. Pat. No. 8,063,813 entitled "Active improvised explosive device (IED) electronic signature detection"; U.S. Pat. No. 8,537,050 entitled "Identification and analysis of source emissions through harmonic phase comparison"; U.S. Pat. No. 8,643,539 entitled "Advance manufacturing monitoring and diagnostic tool"; U.S. Pat. No. 8,825,823 entitled "System and method for physically detecting, identifying, diagnosing and geolocating electronic devices connectable to a network"; U.S. Pat. No. 9,205,270 entitled "METHOD AND APPARATUS FOR THE DIAGNOSIS AND PROGNOSIS OF ACTIVE IMPLANTS IN OR ATTACHED TO BIOLOGICAL HOSTS OR SYSTEMS"; U.S. Pat. No. 8,825,823 entitled "SYSTEM AND METHOD FOR PHYSICALLY DETECTING, IDENTIFYING, DIAGNOSING AND GEOLOCATING ELECTRONIC DEVICES CONNECTABLE TO A NETWORK"; U.S. Pat. No. 9,059,189 entitled "INTEGRATED CIRCUIT WITH ELECTROMAGNETIC ENERGY ANOMALY DETECTION AND PROCESSING"; US Pub. 2012-0226463 entitled "SYSTEM AND METHOD FOR PHYSICALLY DETECTING COUNTERFEIT ELECTRONICS"; US Pub. 2013-0229310 entitled "SYSTEM AND METHOD FOR GEO-LOCATING AND DETECTING SOURCE OF ELECTROMAGNETIC EMISSIONS"; U.S. Pat. No. 8,537,050 entitled "IDENTIFICATION AND ANALYSIS OF SOURCE EMISSIONS THROUGH HARMONIC PHASE COMPARISON"; US Pub. 2013-0328710, entitled "Method and Apparatus for Detection and Identification of Counterfeit and Substandard Electronics"; U.S. Pat. No. 9,205,270 entitled "Method and Apparatus for the Diagnosis and Prognosis of Active Implants in or Attached to Biological Hosts or Systems"; US 2013-0229310 A1 entitled "System and Method for Geolocating and Detecting Source of Electromagnetic Emissions"; US Pub. 2012-0226463 A1 entitled "System and Method for Physically Detecting Counterfeit Electronics"; U.S. Pat. No. 9,059,189 entitled "Integrated Circuit with Electromagnetic Energy Anomaly Detection and Processing"; U.S. Pat. No. 9,285,463 entitled "Method and Apparatus for battle damage assessment of electric or electronic devices"); US Pub. 2015-0137830 A1 entitled "Method and Apparatus for Detection and Identification of Counterfeit and Substandard Electronics", US 2014-0218229 A1 Pub. entitled "Advance Manufacturing Monitoring and Diagnostic Tool"; PCT/US2015/014765 entitled "METHOD AND APPARATUS FOR DETECTION AND IDENTIFICATION OF COUNTERFEIT AND SUBSTANDARD ELECTRONICS "and US Pub. 2015-0009073 A1 entitled "System and Method for Physically Detecting, Identifying, Diagnosing and Geolocating Electronic Devices Connectable to a network".

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND

1. Technical Field

The subject matter relates to electronic devices. It further relates to generation and processing of emissions from electronic device.

2. Description of Related Art

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Conventionally employed solutions to wirelessly transmit a signal or a state of an electronic device can employ complex circuits configured to communicate with the electronic device information is stored. Such radio from which the state or audio, (IR), frequency (RF), infra-red light or other electromagnetic circuit control means can be typically employed and their intended frequency signal allocation, configuration and design is specified to conform to the electronics and commercial FCC frequency allocations recognized worldwide. These conventionally employed solutions can typically require the choice and pre-calculated circuitry tolerances, power levels, transmission range calculations and part specifications. These conventionally employed solutions may not employ an ad-hoc design, nor do they utilize existing hardware and/or software resource. The above described solutions typically employ a recognized standard modulation means. Further, the above described solutions typically require additional hardware expense. Further, the above described solutions typically require the addition of a substantial number of circuit elements dedicated to creating the transmit signal, typically more than 10. The conventional electronic devices cannot be easily and quickly modified and/or retrofitted into existing hardware or software. The conventional solutions cannot be employed outside legally allocated frequency bands without power limitations and may interfere with other sensitive electronic equipment.

BRIEF DESCRIPTION OF THE DRAWINGS

The accompanying drawings are incorporated in and constitute part of the specification and illustrate various embodiments. In the drawings:

FIG. 9 illustrates an exemplary assembly source code computer language segment of instructions which generate desired RF emissions under controlled conditions;

FIG. 10A-10D illustrate an VHDL firmware exemplary ring oscillator, logic diagram representations of the exemplary ring oscillator, and hardware microcircuit of the exemplary ring oscillators;

DETAILED DESCRIPTION OF EXEMPLARY EMBODIMENTS

Figure 1:
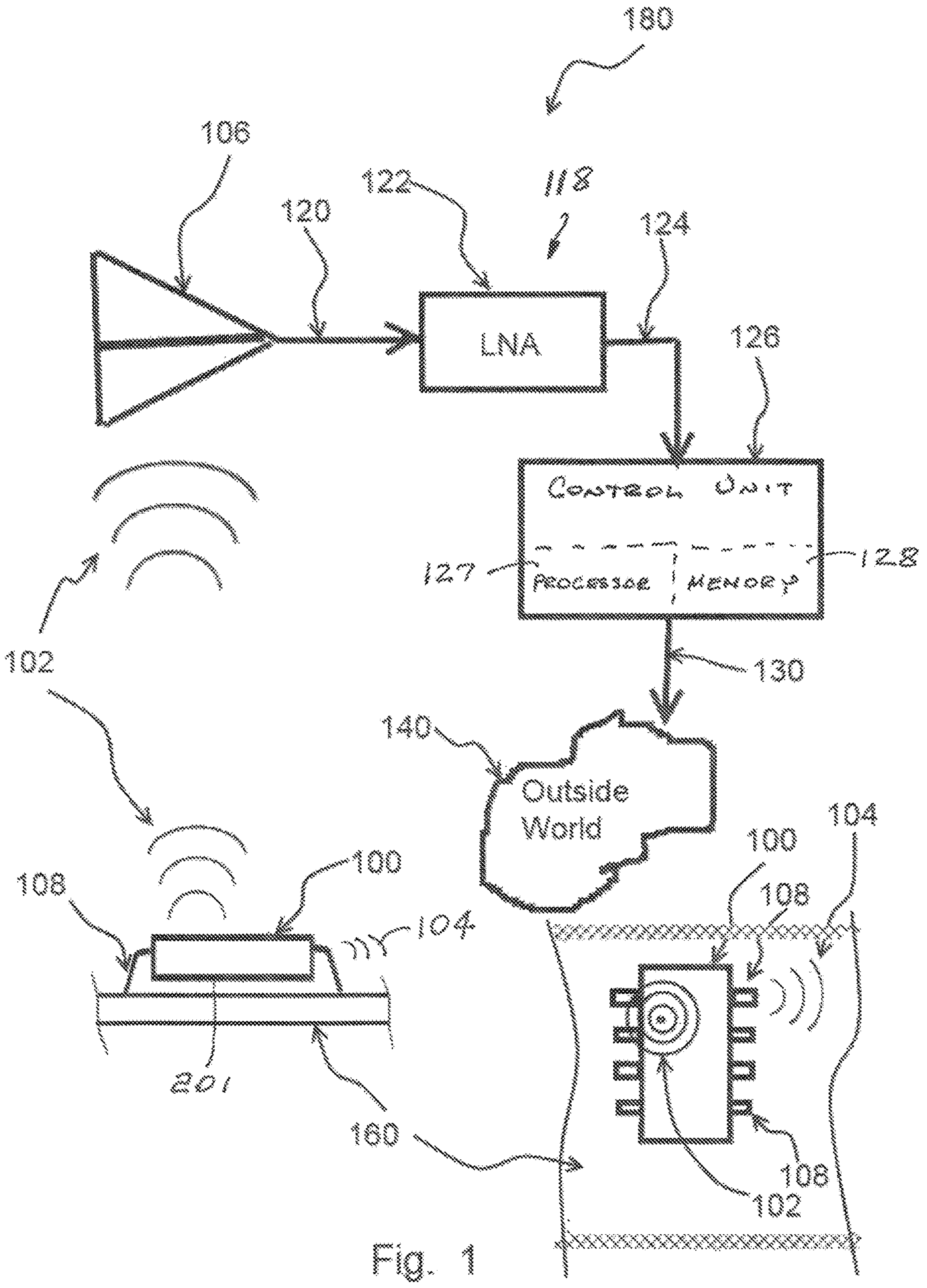
FIG. 1 illustrates an exemplary system of generating and processing RF emissions from an electronic device.

Prior to proceeding to the more detailed description of the present invention, it should be noted that, for the sake of clarity and understanding, identical components which have identical functions have been identified with identical reference numerals throughout the several views illustrated in the drawing figures.

The following detailed description is merely exemplary in nature and is not intended to limit the described examples or the application and uses of the described examples. As used herein, the words "example", "exemplary" or "illustrative" means "serving as an example, instance, or illustration." Any implementation described herein as "example", "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

The term "or" when used in this specification and the appended claims is not meant to be exclusive; rather the term is inclusive, meaning either or both.

The term "couple" or "coupled" when used in this specification and appended claims refers to an indirect or direct physical connection between the identified elements, components, or objects. Often the manner of the coupling will be related specifically to the manner in which the two coupled elements interact.

The term "directly coupled" or "coupled directly," when used in this specification and appended claims, refers to a physical connection between identified elements, components, or objects, in which no other element, component, or object resides between those identified as being directly coupled.

The term "operatively coupled," when used in this specification and appended claims, refers to a physical connection between identified elements, components, or objects, wherein operation of one of the identified elements, components, or objects, results in operation of another of the identified elements, components, or objects.

It is to be understood that the singular forms "a," "an," and "the" include plural referents unless the context clearly dictates otherwise. Thus, for example, reference to "a circuit" includes reference to one or more of such circuits.

It is to be understood that electromagnetic emissions may be, but is not limited to radio frequency (RF) emissions, microwave emissions, millimeter wave emissions and terahertz wave emissions. It is further to be understood that the term "communication" implies conveyance of information ranging from very simple yes/no existence or power on/off status to detailed data with complex multiple state and data content. Further, it is to be understood that the term 'Outside World' is any device or individual outside of RF the detection and decoding apparatus.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Furthermore, there is no intention to be bound by any expressed or implied theory presented in the preceding technical field, background, or the following detailed description. It is also to be understood that the specific devices and processes illustrated in the attached drawings, and described in the following specification, are simply examples of the inventive concepts defined in the appended claims. Hence, specific dimensions and other physical characteristics relating to the examples disclosed herein are not to be considered as limiting, unless the claims expressly state otherwise.

The particular embodiments of the present disclosure generally provide devices, apparatuses, and methods directed to generating and processing emissions of electromagnetic energy.

In particular embodiments, a semiconductor device comprises a semiconductor substrate, one or more circuits disposed on the semiconductor substrate, and particular embodiments employ a means for modifying, without changing a designed interface functionality of said semiconductor device, characteristic(s) of an electromagnetic energy emittable from the semiconductor device.

In some embodiments, a hardware, software or firmware can be modified to generate RF emission of varying information content ranging from a simple device On/Off to a complex RF emission(s), wherein complex emissions may be comprised and reliably decodable into a significant number of data bits, typically over 8 bits.

Now in reference to Figures, FIG. 1, illustrates an exemplary embodiment of an apparatus (system) 180 directed towards receiving and processing electromagnetic energy emissions 102, 104 from an electronic device 100. In this exemplary embodiment, the electromagnetic energy emission 102 or 104 is in a radio frequency (RF) range and defines a RF signal. The electronic device 100 is illustrated as being mounted on a printed circuit board (PCB) 160 and is powered, during operation, through one or more input/output (I/O) pins 108. The apparatus 180 comprises an antenna 106 to capture or receive emitted RF signal. The apparatus 180 also comprises a receiver 118 and the antenna 106 is illustrated as being coupled to the receiver 118. The receiver 118 at least comprises and/or is represented by a low noise amplifier (LNA) 122. The antenna 106 can be coupled to the LNA 122 through a conductor cable 120. The RF signal acquired by antenna 106 is transmitted through the conductor cable 120 to (LNA) 122 where it is amplified to a level suitable for processing. The apparatus 180 also comprises a control unit 126. The control unit 126 is coupled to the receiver 118, for example with another conductor cable 124. Amplified RF signal is transmitted through the cable 124 to the control unit 126. The control unit 126 is configured to process and/or examine the data within the amplified RF signal in accordance with a predetermined logic. The results of the processing and/or examination of the RF signals can be optionally conveyed using a communication line 130, which may also be a wireless communication means, to the outside world 140 where it is acted upon or optionally ignored. The outside world 140 may log the events sent to it from the communication line over 130, may generate an alarm or alert based on the events sent to it over the communication line 130, or may further process the data within the RF signal sent over the communication line 130.

The control unit 126 is shown as of a microprocessor type comprising one or more processors 127 and non-transitory tangible computer readable medium and/or tangible computational medium comprising algorithms and/or executable instructions, that cause the one or more processors 127 to provide elements of various embodiments. One example of such elements can be processing of data or information contained within RF emission signal from the electronic device 100. The algorithms and/or executable instructions are stored in a non-transitory storage medium 128. The control unit 126 may be provided as a custom manufactured controller, a programmable logic controller (PLC), a computer, a System On Chip (SoC), a Multi-Chip Module (MCM) or a portable device that includes, but is not limited to, a cell phone, a smart phone, a portable personal computer, a pad, a tablet or the like.

The control unit 126 may be configured as a simple bandpass filter tuned to the modified frequency of emission of interest.

Tangible computer readable medium means any physical object or computer element that can store and/or execute computer instructions. Examples of tangible computer readable medium include, but not limited to, a compact disc (CD), digital versatile disc (DVD), blu-ray disc (BD), usb floppy drive, floppy disk, random access memory (RAM), read-only memory (ROM), erasable programmable read-only memory (EPROM), optical fiber, etc. It should be noted that the tangible computer readable medium may even be paper or other suitable medium in which the instructions can be electronically captured, such as optical scanning. Where optical scanning occurs, the instructions may be compiled, interpreted, or otherwise processed in a suitable manner, if necessary, and then stored in computer memory. Alternatively, tangible computer readable medium may be a plugin or part of a software code that can be included in, or downloaded and installed into a computer application. As a plugin, it may be embeddable in any kind of computer document, such as a webpage, word document, pdf file, mp3 file, etc.

Figure 2:
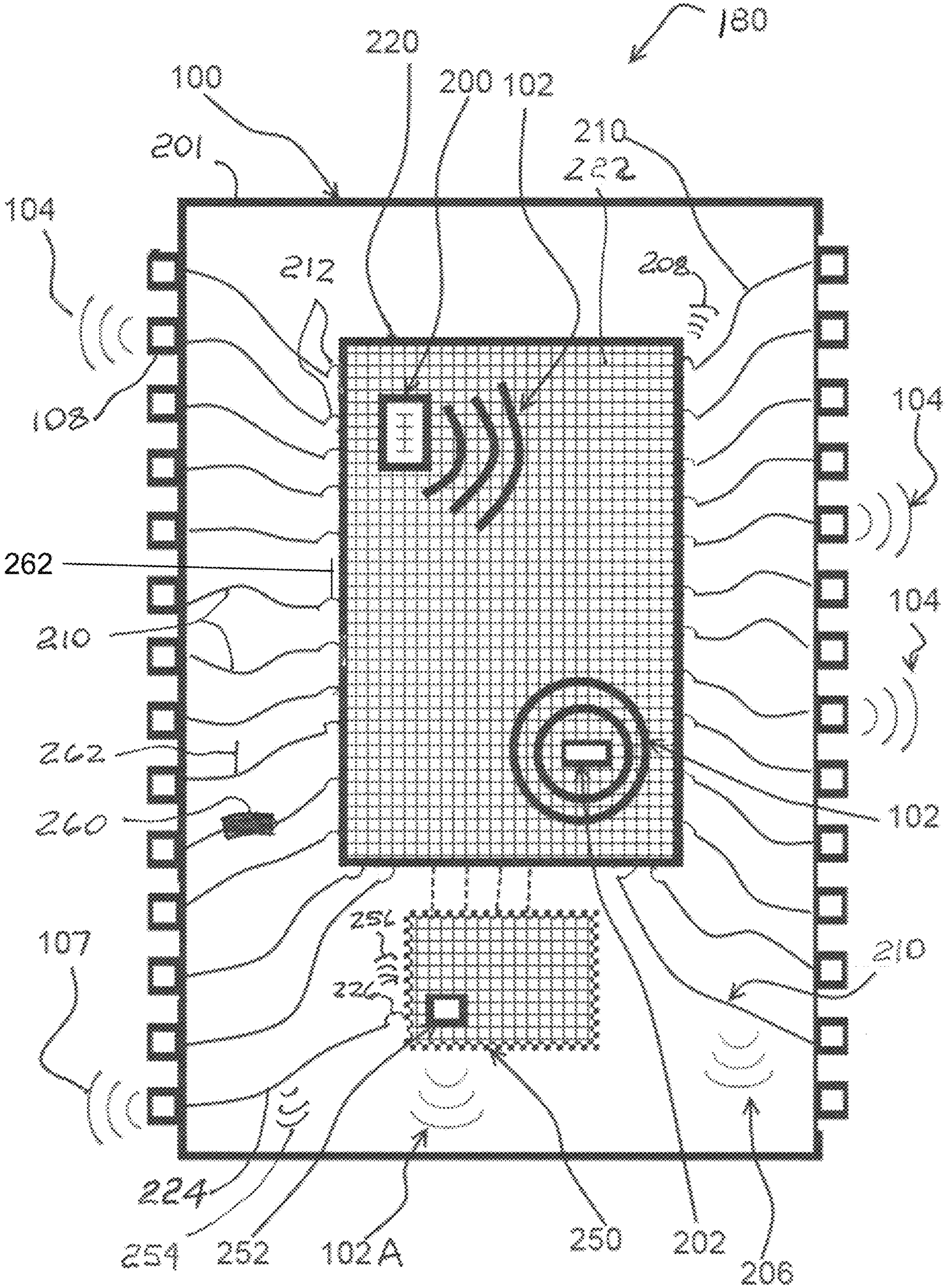
FIG. 2 illustrates an enlarged view of the electronic device of FIG. 1.

FIG. 2 illustrates an enlarged view of the electronic device of FIG. 1, albeit with more pins 108. More particularly, the electronic device 100 is illustrated as an integrated circuit (IC) device. The electronic device 100 can be also any one of a field-programmable gate array (FPGA), an application-specific integrated circuit (ASIC), a multichip module, a logic gate, a SoC, an MCM or any combination thereof. As is conventional, the IC 100 comprises a package (casing) 201, the above mentioned I/O pins 108 that extend from the package (casing) 201, a die 220 comprising a substrate 222, one or more circuits or circuit elements 200, 202 on the substrate 222, leads 210 each being electrically coupled to a respective I/O pin 108, and bonding wires 212 coupling the die 220 to each lead 210. The die 220 with the one or more circuit element 200, 202 can be also referred to as a chip. The exact structure of the die 220 is omitted herein for the sake of brevity. Some I/O pin(s) 108 are generally configured to provide power (voltage) and/or clock signal to the chip 220.

The circuit (logic) element 200, 202 is to be understood as any constituent part of a circuit that contributes directly to its operation and performs a definable function. Examples can include transistors, resistors, capacitors, inductors, and interconnections. The package 201 is to be understood as an enclosure for one or more semiconductor chips (dice), film elements, or other components, that allows electrical connection and provides mechanical and environmental protection.

The substrate 222 of the die 220 may include a silicon substrate, a silicon germanium (SiGe) substrate, a bulk semiconductor substrate, a strained semiconductor substrate, a compound semiconductor substrate, a silicon-on-insulator (SOI) substrate or other commonly or uncommonly used semiconductor substrates.

FIG. 2 also illustrates that IC 100 generates RF emissions 102 from the circuit element 200 that contain different signature characteristics than RF signature characteristics from the emissions 104 from one or more I/O pins 108. It is also contemplated that each pin 108 can generate RF emissions with different signature characteristics due to specific application. For example, different voltage may be present at each I/O pin 108. FIG. 2 further illustrates that IC 100 can generate electromagnetic energy emission(s) 206 from the lead 210 or electromagnetic energy emission(s) 208 from each bonding wire 212. More than one die can be provided within the IC 100, for example such as an additional die 250 containing one or more circuit element 252 and coupled with a lead 224 and bonding wire 226 to the I/O pin 108. Similarly, the die 250 can generate RF emissions 102A from the one or more circuit elements 252, emissions 107 from the I/O pin 108, RF emissions 254 from the lead 224 and even RF emissions 256 from the bonding wire 226.

The die 220, 252 or the IC 100 can also comprise redistribution layer (RDL) not shown.

Furthermore, although the IC 100 is illustrated as having I/O pins 108, such I/O pins 108 can be replaced with solder bumps (not shown) or ball grid array (not shown) for I/O purposes to the IC 100. The pins 108, solder bumps (not shown) and ball grid array (not shown) provide means for attaching the IC 100 to a substrate, for example such as a printed circuit board.

The RF emissions 102 originating from the one or more circuit element 200, 202 inside the die 220, or RF emissions 104 originating from the I/O pin(s) 108, RF emissions 206 originating from the leads 210 or RF emissions 208 from the bonding wires 212, are emitted based on the logic configurations contained in the portion of the chip at location 200, or 202. These logic configurations at locations 200 or 202 may be a ring oscillator, or other circuit or a circuit element that may contain a repeating, semi-repeating, or iterative pattern of operation. The size of a possible ring oscillator may be controlled by state inputs to the RF generation circuit and the emitted RF signal may be modified and its modified state may be received, processed and communicated by the apparatus 180.

Figure 3:
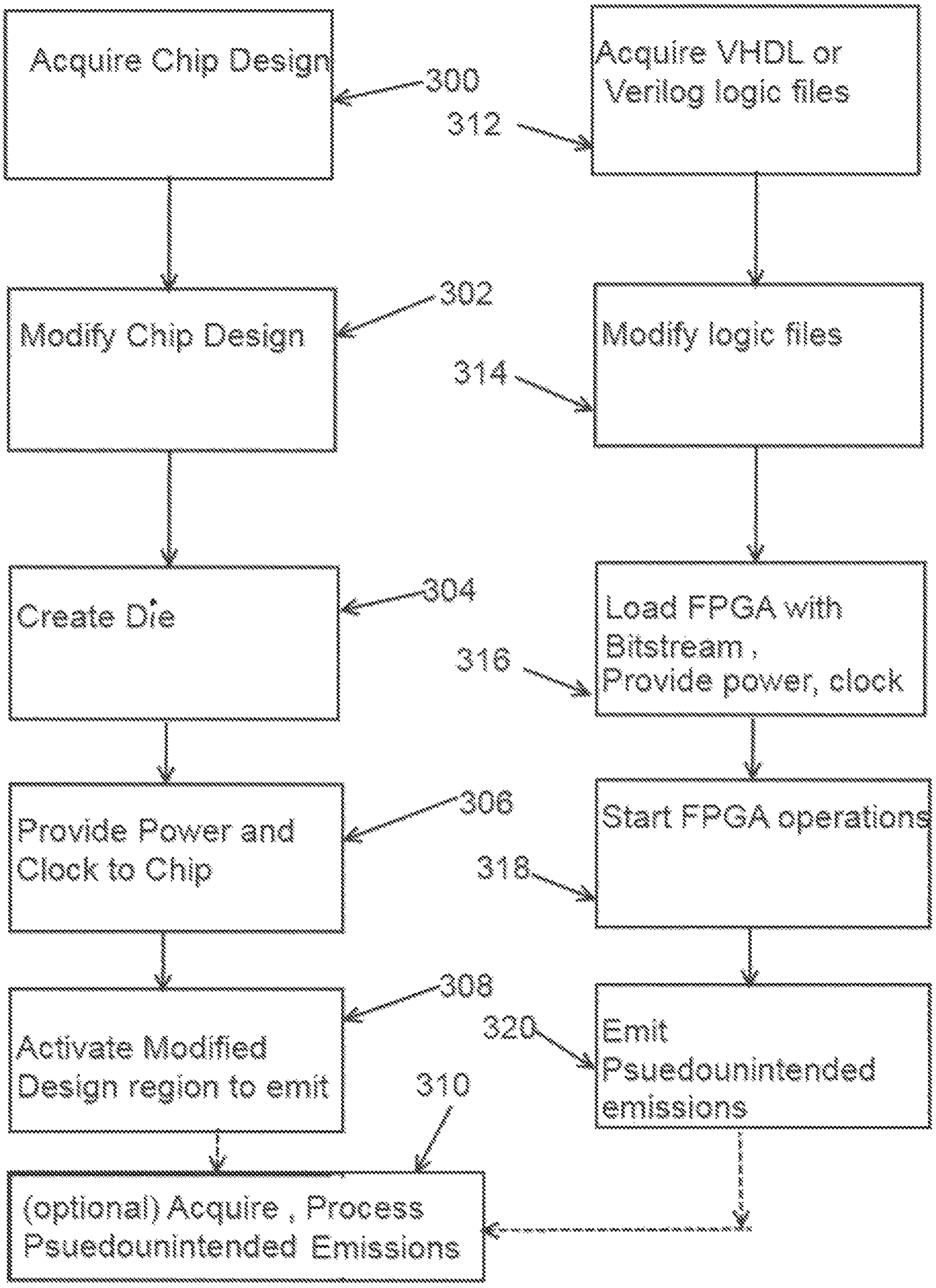
FIG. 3 illustrates a flowchart of an exemplary method of generating RF emissions from a hardware modification.

FIG. 3 illustrates a flowchart of an exemplary method to create or generate a modified RF emission with desired (signature) characteristic(s) within hardware or firmware logic of the chip. In step 300, hardware design of the existing die or chip is acquired. In step 302, the existing chip hardware design s modified to include additional or new RF emission element(s) into one or more circuits, for example such as the circuit/circuit elements 200, 202 or 252. The modified circuit at locations 200, 202, 252 would now be operable to generate the desired RF characteristic(s). The examples of these additional or new RF emission element(s) will be described further in this document. In step 304, the new design is instantiated into a created die, and typically placed in a package, such as IC 100, and can be later installed on a PCB 160 with the PCB 160 being integrated into a higher level assembly, for example such as a computer. In step 306, at least power and necessary clock signal(s) are connected, generally during operation or testing, to respective pins of the chip 100 containing the newly created die. In step 308, the modified region, for example such as the modified circuit 200 is activated, and begins emitting RF emission 102 with desired characteristic(s). Such RF emissions with desired characteristic(s) can be characterized as "pseudointended" emissions due to a forced or a predetermined nature of their generation. Further, such emissions can be conducted emissions which are coupled into the traces, interconnects, wiring, pins and/or external traces or wiring for further emission and emission strength. In optional step 310 the RF emission, such as any one of RF emissions 102, 102A, 104, 206, 208, and 256 is acquired or harvested, for example by an antenna 106 of FIG. 1, and processed by the apparatus 180 to extract the data from RF signal. Since, the chip 100 will generate any of the above RF emissions when power signal or power and clock signals are connected to respective pin(s), the chip 100 does not have to be fully operational. In other words, the chip 100 will generate RF emissions 102, 104, even when the circuits or circuit elements 200, 202 and/or 252 are not energized or operate. Thus, the RF emissions from the chip 100 under these conditions can be considered as unintended emissions. However, the RF emissions can be also generated, captured and processed when the chip 100 is fully operational. Thus, the RF emissions from the operating chip 100 can be considered as intended emissions.

With further particular reference to FIG. 3, therein is also shown a step 312 of acquiring an existing hardware description language file, such as VHDL or Verilog logic file to be modified to add a desired RF emission. In step 314, the existing logic files obtained in step 312 are modified to contain a RF emission emitting logic configuration, for example such as a ring oscillator. In step 316, the modified VHDL is suitably compiled on the vendor's VHDL to Bit file translation software for the device it is to run on and loaded into the chip 100 to be executed. In step 318, the operation of the chip 100, for example such as FPGA, is started, causing step 320 to energize the logic circuit 200 and emit RF emissions. Again, in the optional step 310, the RF emissions may be acquired and processed for indication of FPGA internal state, configuration or authenticity, and then optionally communicated to the external world 140, where a computer, individual human, or transmitter may then use, or perform a data logging operation for example. The VHDL code could represent a binary counter, a ring oscillator, or typically a similar variety of logic circuits which substantially repeat their operation. Based on the state of binary input lines, the specific end count or preset start count may be established, modifying the operation of a binary counter, thus modifying the RF based on the state of binary input lines.

Figure 4:
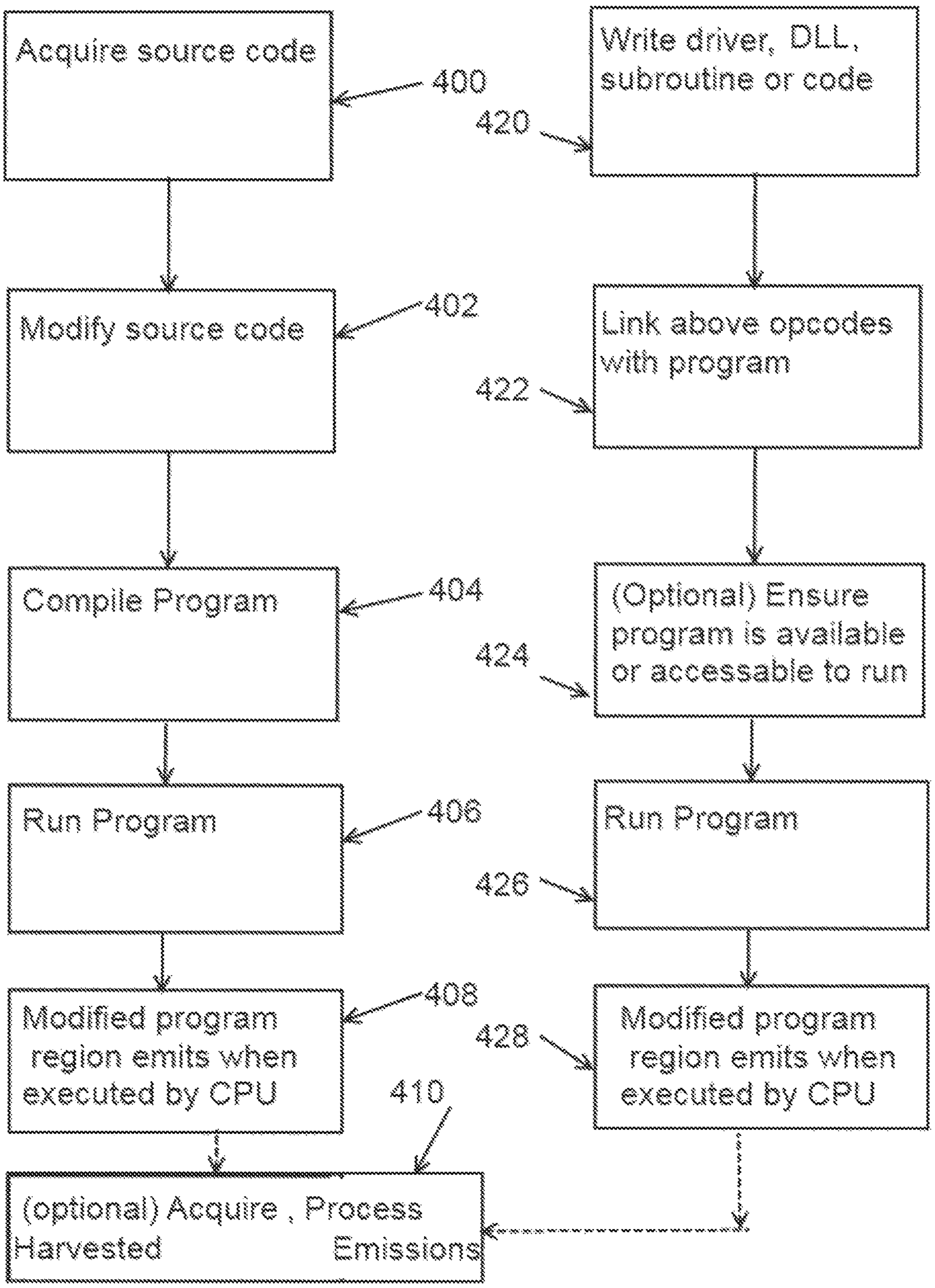
FIG. 4 illustrates a flowchart of an exemplary method of generating RF emissions from a software modification.

FIG. 4 illustrates a flowchart of an exemplary method to create a RF emission with desired characteristic(s) within a software entity instead of a hardware entity of FIG. 3. In step 400, an existing source code meant to be running inside of the chip 100 is acquired. In step 402, the source code acquired in step 400 is modified to add RF emission generating code or logic, for example such as an assembler code 900 shown in FIG. 5. The no-optimization option of the assembler or compiler can be enabled to prevent optimizing redundant operations away in the final compiled version of the object code resulting from the assembled or compiled code. In step 404, the program is modified and compiled and executable code generated to contain both the new RF emissions generating code and the original code acquired in 400. In step 406, the newly generated program is executed, for example on a central processing unit (CPU) such as 100, capable of running the executable code generated. In step 408, the modified region containing the new code which creates a RF emission is run, and RF emission with desired characteristic(s) is emitted. In optional step 410, the previously generated RF emission is acquired, for example with antenna 106 of FIG. 1 and processed in a similar manner to processing in step 310.

FIG. 4 similarly shows a set of steps 420, 422, 424, 426 and 428 wherein a separate driver, subroutine, method, or dynamic link library (DLL) is created containing the modified RF emission containing code and linked to run with the existing program, with similar results.

Figure 5A:
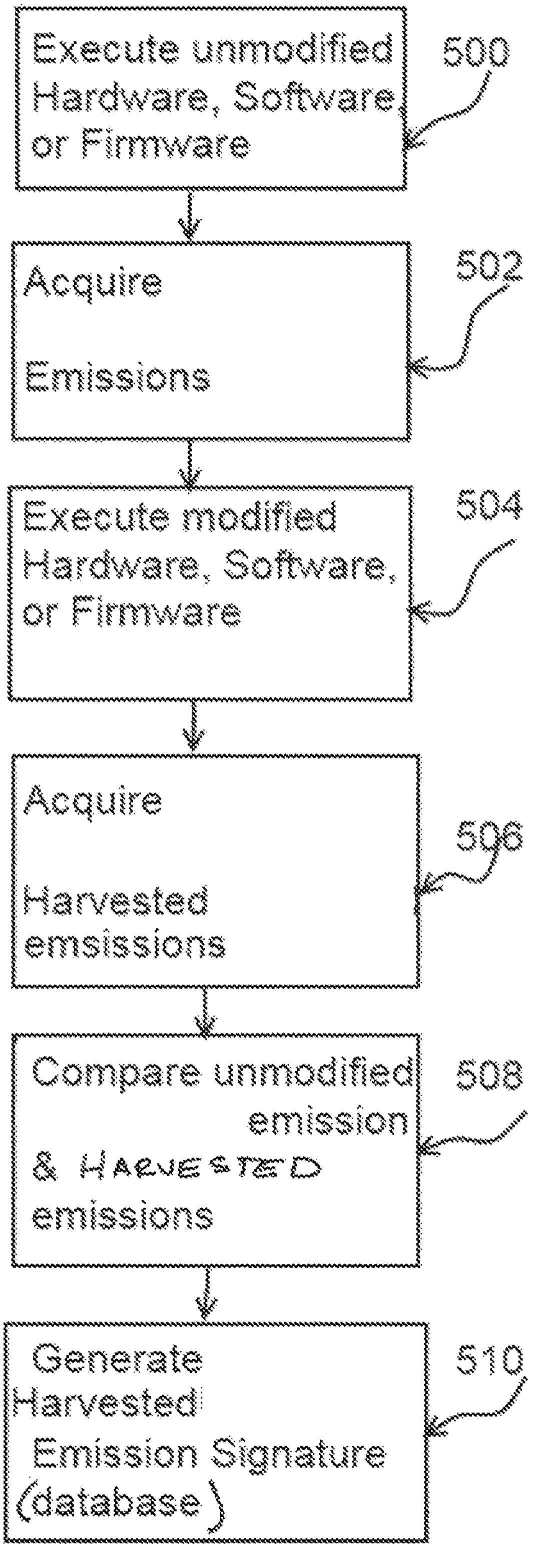
FIGS. 5A and 5B illustrate flowcharts of exemplary methods of detecting and determining desired RF signal characteristics due to hardware, software or firmware modifications.

FIG. 5A illustrates a flowchart of an exemplary method of finding the frequency location of the generated RF signal due to any one 4 hardware (HW), software (SW) and firmware (FW) modification. In step 500, the RF emissions generated from the unmodified hardware, firmware or software existing in a program, ASIC, or FPGA is acquired by an apparatus, that can be the apparatus 180 of FIG. 1. Alternatively, the modified software without the necessary state to cause the modified RF generating code to be activated is executed. In step 502 the (original, unmodified) RF emissions are acquired, by an apparatus, that can be the apparatus 180 of FIG. 1. In step 504, the modified software, firmware or hardware containing the RF code modifications is executed. For example, the IC 100 can be connected to supply of power. Or the IC 100 can be operated in accordance with designed parameters. In step 506, the RF emissions, due to modification(s) are generated and similarly captured by the antenna 106 and processed, for example by the apparatus 180 of FIG. 1. In step 508, the unmodified RF emissions acquired in step 502 and RF emissions acquired in step 506 are compared therebetween, and the RF signal is located across one or more frequency locations and spans such as the one shown in FIGS. 6A-B described below. Optional database of harnessed emission signatures can be generated in step 510 for further use. Emission signature can include one or more characteristics of the emission waveform of FIGS. 6A-B.

Figure 5B:
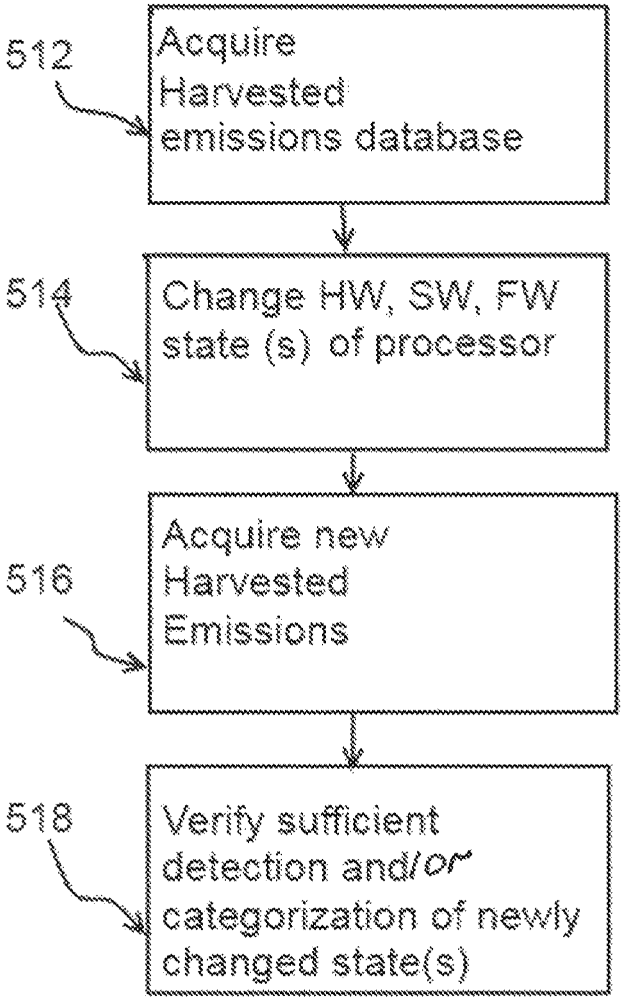

FIG. 5B illustrates a flowchart of an exemplary method of verifying desired detection and/or categorization of the changed states or using the apparatus. In step 512, the database of emissions signatures is acquired. The database of emissions signatures can be the one that was generated in step 510. In step 514, the state(s) of the hardware, software or firmware is (are) changed or modified. New RF emissions are then harvested in step 516 desired and detection and/or categorization of the changed states is verified in step 518. It is important to note that the state changes in 514 may consist of simply turning on the device, for example such as the IC 100, under test. In some cases, step 514 is optional and may be skipped if the device is already on.

Figure 6A:
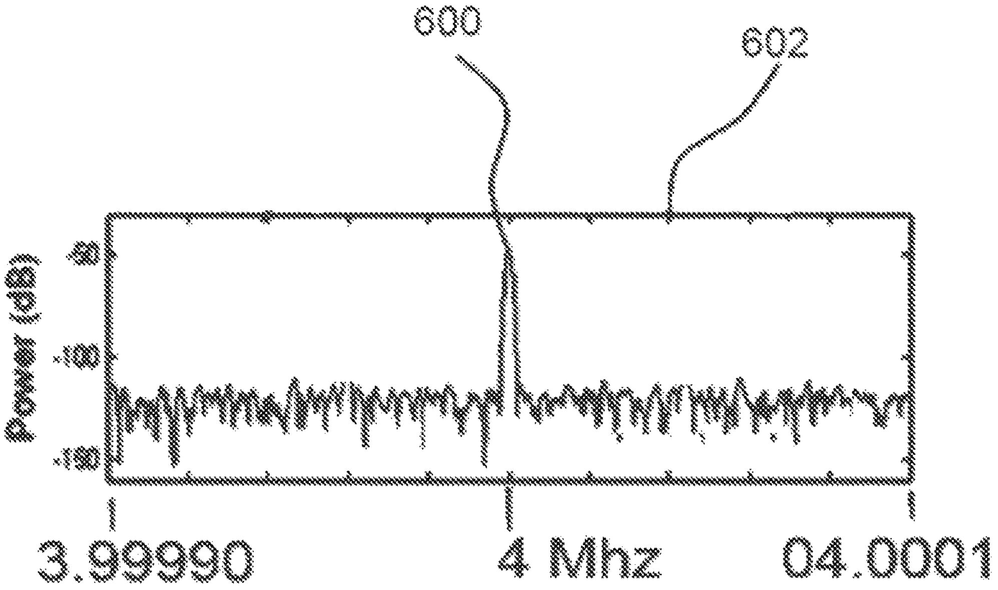
FIGS. 6A-6B illustrates an exemplary spectrum change as a result of a modification causing a desired RF emission.
Figure 6B:
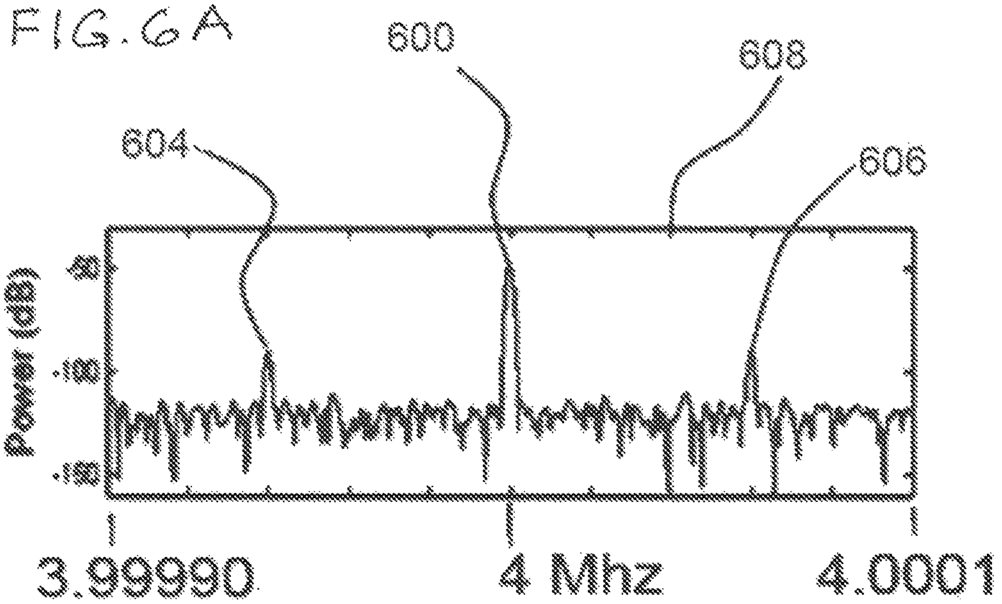

FIG. 6A illustrates a waveform 602 of the RF emissions generated from step 502 of FIG. 5 and FIG. 6B illustrates a waveform 608 of RF emissions generated from step 506. A comparison between waveforms 602 and 608 shows desired peaks 606 and 604 that are result of the hardware, firmware or software modifications in accordance with methods of FIGS. 3 and 4. The peak 600 may be present and is common to both modified and unmodified apparatuses.

Figure 7:
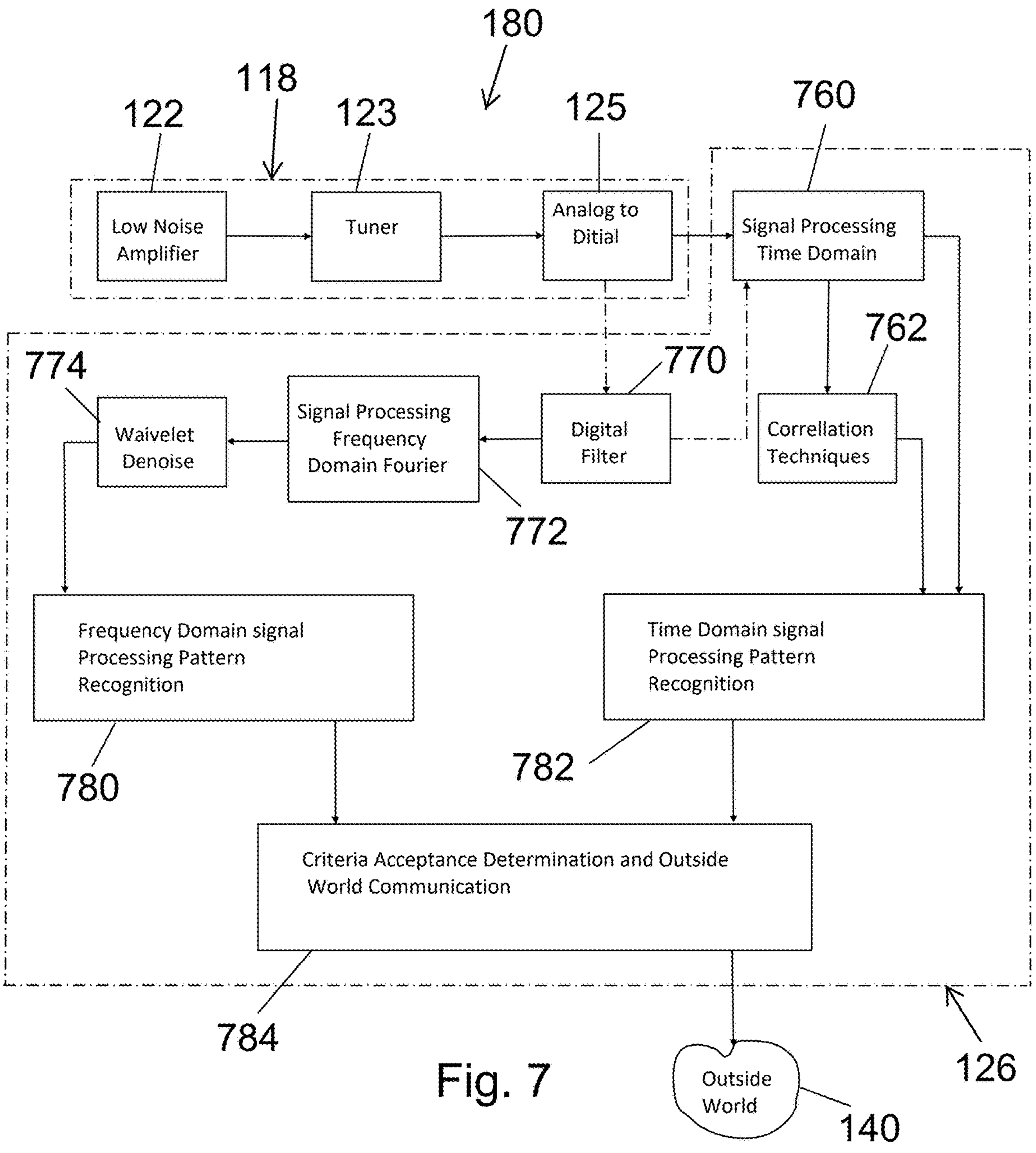
FIG. 7 illustrates an exemplary hardware configuration to receive and decode RF emission data.

FIG. 7 illustrates additional details of the apparatus 180 of FIG. 1.

The receiver 118 is illustrated as comprising a tuner 123 coupled to the LNA 122 and the Analog-To-Digital Converter (ADC) 125 coupled to tuner 123. The output from the (ADC) 125 is received at the control unit 126.

In the embodiment of FIG. 7, the control unit 126 is illustrated by functional modules. The optional time domain module 760 receives RF signal in digital form from the ADC 125 and process it in accordance with a predetermined logic. The output from the time domain module 760 is received at the correlation techniques module 762 and is also received at the processing module 782.

Optional Digital filter 770 also receives RF signal in digital form from the ADC 125 for filtering for further use by the frequency domain module 772 that is programmed to execute filtered RF Fourier Transforms on the signal for optional further wavelet de-noising at optional wavelet de-noising module 774. In place of the Fourier transform in 772, other transforms may be used such as one or more Goertzel algorithm or one or more Filters such as FIR filters tuned to specific frequencies discovered in step 508 may be used. The optional module 780 may extract, in a response to received processed RF signal from optional wavelet de-noising module 774, state-specific features of the RF signal, for example such as frequency distance between peak 604 and peak 600 or the relative dB height difference between peaks 604 and 600. The processing module 782 may comprise, in a response to received processed RF signal from time domain module 760, recognition of time domain RF features, for example such as a periodic increase and decrease of the received amplitude at a very specific filtered frequency. The processing module 782 may thus comprise a narrow FIR or IIR filter. The output results from modules 780 and 782 are then received at a module 784 for determination of relative criteria being matched. In an example, such relative criteria may comprise a degree of relative peak height difference between peaks 604 and 600 exceeding a predetermined threshold. In an example, such relative criteria may comprise a periodic amplitude change at a specific frequency being within the expected time period maximum and minimum. The results of processing in module 784 can be then transmitted to outside world 140, stored for further retrieval or displayed on a display (not shown) that can be integrated into the control unit 126 or coupled thereto. It must be noted that both time domain and frequency domain processing are not necessary, it could be one or the other. As an example, Elements 760, 762 and 782 may be absent.

Figure 8:
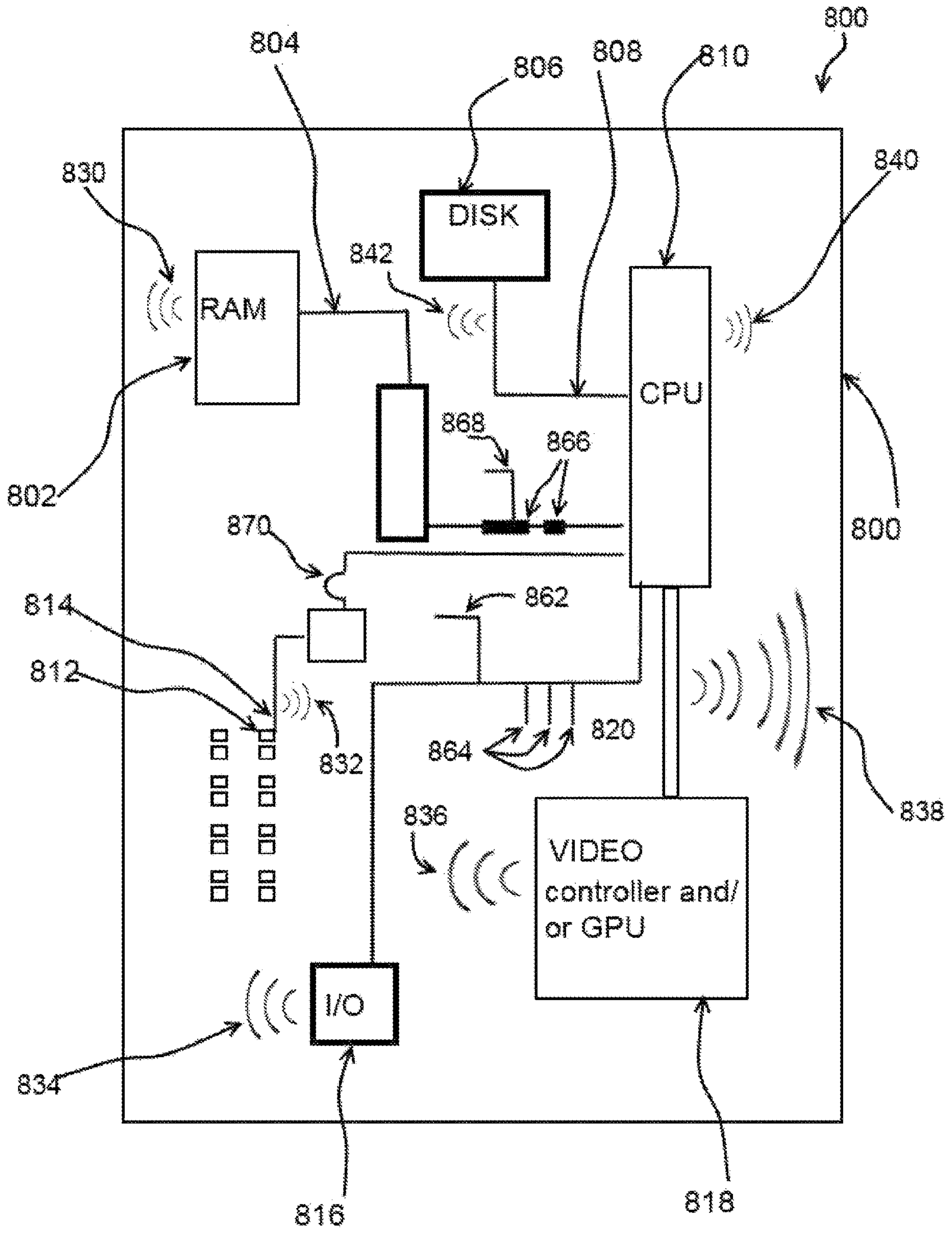
FIG. 8 illustrates an exemplary embodiment wherein the electromagnetic emission is generated by modification(s) to a computer, Printed Circuit Board (PCB) assemblies or Multi-chip modules.

FIG. 8 illustrates an embodiment wherein the electromagnetic emission(s) being generated by an electronic device, such as a computer 800. The computer 800 can be any one of a laptop, desk top, tablet, portable computer and even a mobile communication device. The electronic device 800 can be also a network computer or a server. The electronic device 800 may be one motherboard, or any device that comprises one or more of circuit boards.

Specifically, when the electronic device 800 is provided as a computer, different locations/components within the computer 800 can emit RF signals. The emitted RF signals may be of a variety of frequencies and a variety of locations as multiple components may be involved in the creation of the RF signal, the execution of RF code and the RF signal generation. In an example, random access memory (RAM) 802 can generate RF emissions 830 while being accessed, written to, read from, or refreshed. In an example, RAM memory bus 804 can generate RF emissions. In an example, disk 806 and/or interconnect or trace 808 can generate RF emissions 842. In an example, central processing unit (CPU) 810 can generate RF emissions 840. In an example, video controller 818 can generate RF emissions 836. In an example, interconnect or line 820 can generate RF emissions 838. In an example, input/output (I/O) module 816 can generate RF emissions 834. In an example, LED(s) 812 and/or interconnect or line 814 can generate RF emissions 832.

A single or multiple antennas 106 positioned near or around the separate components may be used to more specifically isolate the location of RF emission. Such antenna(s) 106 may be multiplexed to provide input into a single receiver 118 or be associated with separate receivers 118.

In an embodiment, a software subroutine or software method can be written to perform a memory write access of the same value a specific number of iterations, thus causing desired emissions from the RAM memory bus 804 or memory chip assembly emissions 830. The contents of the data iteratively written, the timing of the data written, and/or the memory location of the data written repetitively may thus modify the emissions in a desired manner so as to effectively modulate it, the RF emissions containing the desired data embedded in it.

FIG. 8 also illustrates an embodiment wherein the electromagnetic emission(s) being generated by an electronic device, such a circuit board assembly that incorporates any of the above described devices, for example such as RAM 830 or CPU 810 modified in accordance with embodiments of modifying the die 220, 250 or the IC 100.

In a further reference to FIGS. 3-8, it is to be recognized that hardware, firmware or software authenticity can be determined by deliberately creating the RF emission frequency element feature(s) in the hardware, firmware or software design and later verifying the existence of the RF emission frequency element feature(s) by receiving the RF emissions and performing the signal analysis detailed herein and performing a comparison to expected signal structure, signature and/or definition to assess, evaluate, differentiate, and/or determine hardware, firmware or software authenticity likelihood or probability. It is to be further recognized that firmware integrity can also be evaluated in a similar manner as stated herein, wherein specific RF emission elements are designed into the firmware and are expected to be radiating at expected characteristics when compared with a known good or exemplary part or a statistical average frequency response of a set of known good parts. It is to be further recognized that software CPU loading can be conveyed by placing a software RF element within a software execution loop, and such software RF element periodicity being measured to indicate the execution time of the software execution loop. If the software loop requires more time or less time between RF periodic signals, an indication of a software change or tampering is recognized. Other timing variations between RF periodic signals can be utilized for encoding and later receiving and decoding other internal device or system characteristics such as clock speed slowdown due to CPU heating compensation. Specific RF software emission call modification locations may be placed directly after the software control flow statements such as 'IF' statements or 'FOR' statements to indicate program entry into that code region or routine, number of loop iterations, or entry into and execution of especially unusual or anomalous regions such as error reporting or error trapping regions such as catch clauses. The entry into these code regions may be indicative of specific data values in memory being compared or branches into specific codes due to calls or interrupts. Added wanted or unwanted code, malicious or benign, may result in a delay or prolonged period between repeated executions of RF code. All of these may be detectable.

Thus, the state within the electronic device 100 may be determined through emissions analysis and may consist of hardware authenticity, firmware integrity, software load, data control flow, instruction flow, program state, security state, or the operations of unknown or unexpected code.

The RF code may also be programmed to change operations and hence measureable emissions by sensing known factors within the hardware, firmware or software it has been placed in such as issuing an operating system call to determine amount of free memory and performing a transmission for a longer or shorter period based on, proportional to, or a log function of memory available.

The RF code may also be programmed to change operations and hence measureable emissions by also performing monitoring of network data, serial data or parallel data patterns received by normal operations or by dedicated listening commands directed towards network data traffic. The RF code may similarly perform enquiry operations over a network and the RF may respond based on the response data or state of network interface. The absence or presence of RF data, or the specific state or form of data influencing the RF emission may be based on specific data pattern(s) received/acquired/listened to by the RF code and may then be received by the control unit 126 and processed to match and reflect the characteristics or data contained in an external device read and/or in communication directly or indirectly with the RF over a network. Further, the authenticity of the software, firmware or hardware may be determined by an external device transmitting or offering a unique data pattern to the RF hardware or software area, and a specific corresponding RF pattern response is received by the emission processor 126 and compared against a previously acquired or predetermined standard. As the specific RF characteristics may be designed to be highly complex and practically unpredictable due to highly complex logic and/or a large number of logic elements used in the creation of the RF emission, the resulting emission may be unique and potentially unpredictable and uniquely based on the code sent to the RF element inside the processor. Thus, because the resulting potentially unique and potentially unpredictable emission may be only known and measured previously by an entity who previously created the code and measured the previous emission result, the newly generated re-emission using the previous pattern would only be known and verifiable by the entity who created the pattern and measured the result previously. A plurality of such patterns and substantially unpredictable responses may also be accumulated, effectively used and only knowable to an entity previously in possession of the RF containing device. Different entities may typically have different patterns and responses to verify the operation of a RF containing device. The electronic device 100 may employ self-modifying code capability to further extend its possible number of states and corresponding responses. Such self-modifying code capability may be influenced by the patterns it discerns from surrounding data, hardware or network information, and/or may be accumulated over time creating an ever increasing and more complex challenge response set. Only an entity matching the challenge-response conditions on a similar system running in parallel will thus be able to predict a new or currently modified-updated response to a challenge. A result of the above configurations may be an unpredictable specific repeatable unique challenge and response set unknowable by another entity and knowable only to an entity who has previously created or is simultaneously creating the challenge and measured the response.

It is to be understood that a substantially identically configured system containing a substantially identical RF and executing in parallel may be used to generate exemplary RF emissions and form or determine an exemplary basis for emission characteristics of all substantially similarly configured devices. Thus, the specific RF generating device response need not be initially analyzed in the RF emission domain to later verify its emission comparison. An exemplary device's resulting RF emission may be previously, currently or later analyzed to determine, verify or predict the expected RF emission response of a different yet substantially identically configured unit. The RF emission may be recorded and later verified against an exemplary emission, and need not be immediately evaluated. The RF emissions may thus be recorded in the time domain for later FFT processing and analysis or comparison/verification in the time and/or frequency domain.

As it has been described above, in one or more embodiments, a hardware of an electronic device is modified, without changing a designed interface functionality of the electronic device, characteristic(s) of an electromagnetic energy emittable from the electronic device.

In an example of FIGS. 10A-10D, such modification can be provided by a ring oscillator (RO) circuit that is electrically coupled only to a power input or to a power input and a clock input. FIG. 10A illustrates an VHDL firmware 1002 of the exemplary ring oscillator, FIG. 10B illustrates a bloc diagram representation 1004 of the exemplary ring oscillator, FIG. 10C illustrates another bloc diagram representation 1004 of the exemplary ring oscillator and FIG. 10D illustrates a hardware microcircuit of the exemplary ring oscillator.

In an embodiment, a firmware FPGA configuration can be employed and added to similarly transmit a simple device On/Off state through to complex RF emissions, wherein complex emissions may be comprised and reliably decodable into a significant number of data bits, typically over 8 bits. An RO or a similar circuit may be specifically allocated and configured for that purpose. The size of the RO may be chosen to convey the data content. As an example, a 10 stage RO may convey that it is active and the FPGA in which it resides is operational. A separate 20 stage RO may convey that it is active and in a different separate FPGA or a different FPGA core in the same FPGA in which it resides and is operational and powered. Delay elements such as non-inverting gates such as one or more 'OR' gates with both inputs tied together to the output of one of the inverters and its output tied to the next inverter may be strategically emplaced in one or more locations to further modify its emission characteristics. The RO may be extended in functionality to be modified based on other signals presented to it, thus emitting a different pattern dependent on the state of the signals modifying it. Other circuits such as a pseudo-random generator using shift registers and XOR gates or linear-feedback shift register may be alternatively easily used as an example.

Figure 11:
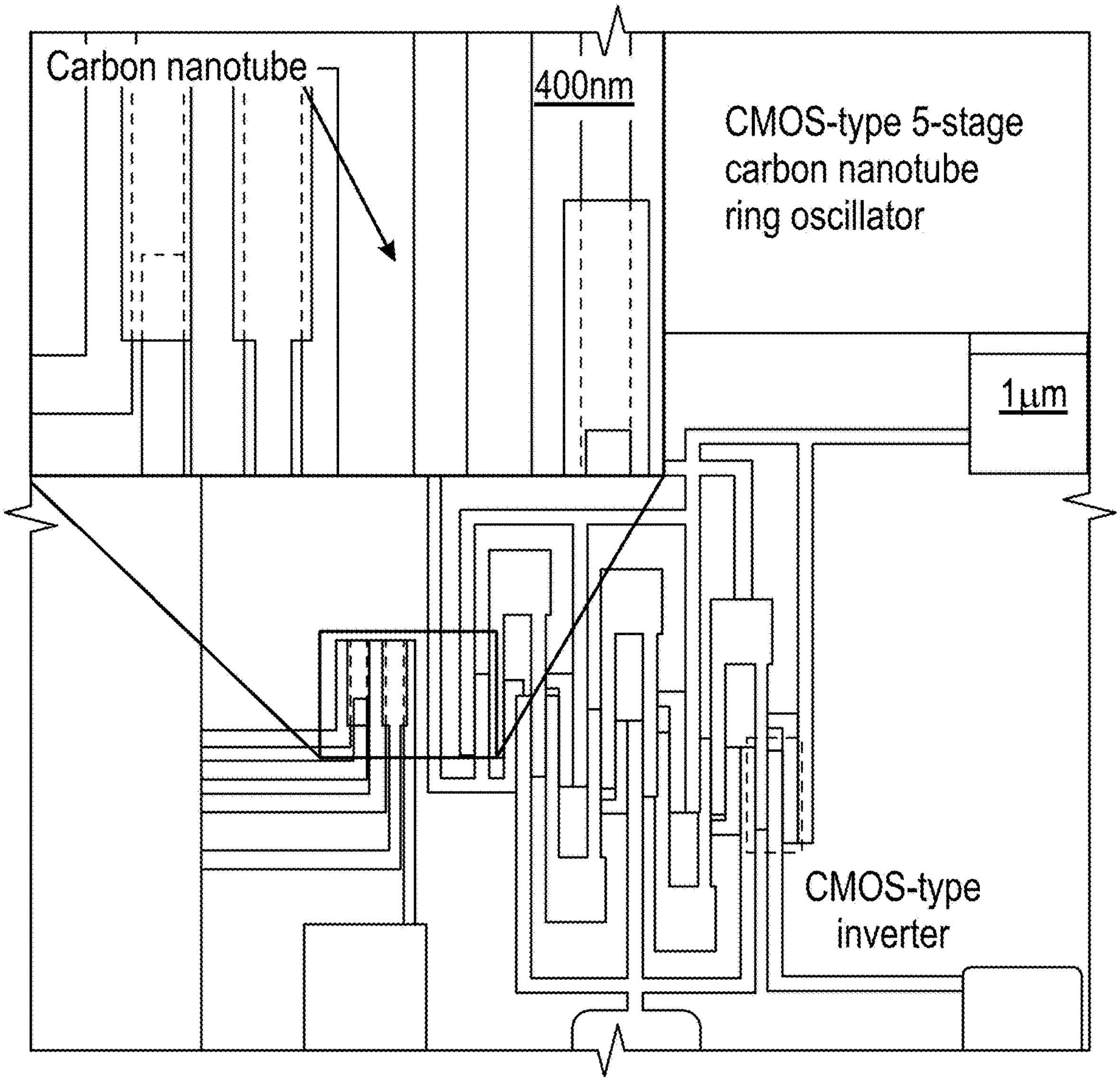
FIG. 11 illustrates an exemplary nanotube constructed illustrates an hardware ring oscillator.

FIG. 11 illustrates an exemplary nanotube constructed hardware ring oscillator 1102.

FIGS. 13-23 illustrate various examples of means for modifying the above described die 220, 250, and/or the above described IC 100, without changing a designed interface functionality of the semiconductor device, characteristic(s) of an electromagnetic energy emittable from the die 220, 250 and/or IC 100. The RF emissions may be enhanced or modified without exceeding the specifications of the manufacturer, thus providing drop in replacement capability and no discernable change to the user of the equipment. For the sake of brevity, the circuit is illustrated by at least a pair of logic (circuit) elements 2313 and 2314 interconnected with each other by an interconnect 2002, each having an interconnect 2302 with the remaining logic element(s), which can be the unused logic element 2028 of FIG. 15, another logic element 2315 of FIG. 23 or pin(s) 2308 of FIGS. 18-23.

Figure 12:
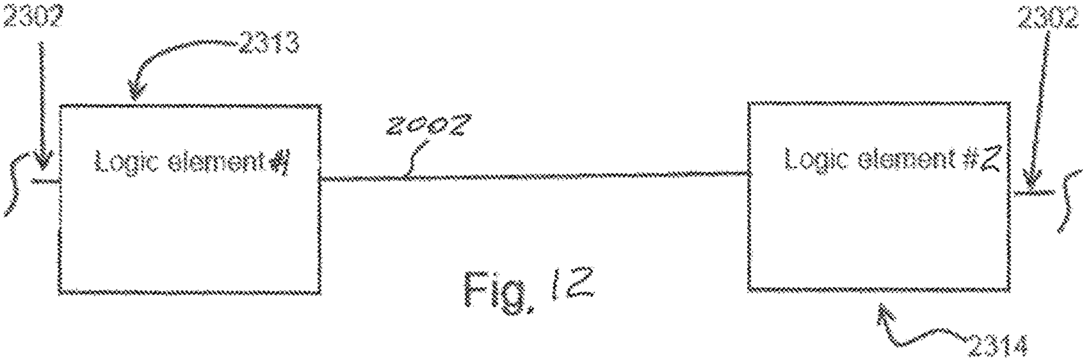
FIG. 12 illustrates an example of a hardware modification of the electronic device of FIGS. 1-2.

For the sake of reader's convenience, FIG. 12 illustrates an unmodified existing pair of logic elements 2313 and 2314 interconnected with other each by an unmodified interconnect 2002 and typically connected to other existing logic elements via interconnect 2302.

Figure 13:
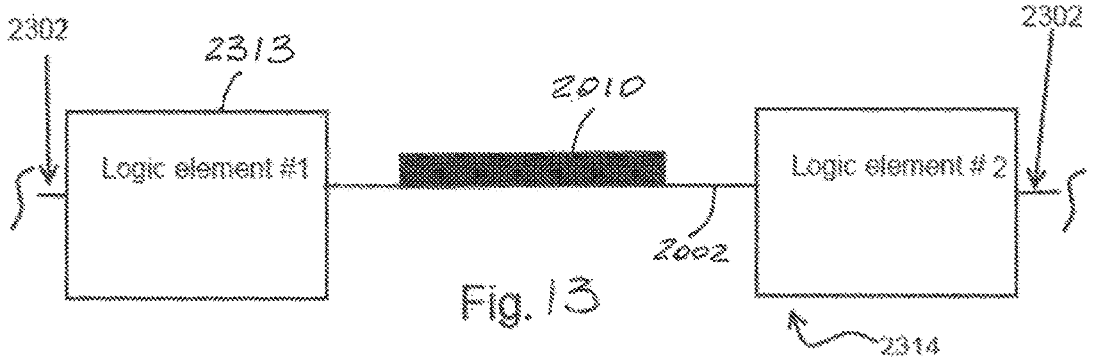
FIG. 13 illustrates an example of a hardware modification of the electronic device of FIGS. 1-2.

FIG. 13 illustrates an example of the pair of logic elements 2313 and 2314 interconnected with each other by the interconnect 2002 modified by a means, such as a section 2010 with a greater width than a width of the interconnect 2002. Increase in width of the interconnect 2002 decreases the impedance from the interconnect 2002. The section 2010 can be disposed to one side of the interconnect 2002 and does not have to be centered on such interconnect 2002. Decrease in impedance is characterized by a decrease of a peak width, for example such as peak 600 of FIG. 6A or peaks 604, 606 of FIG. 6B.

Figure 14:
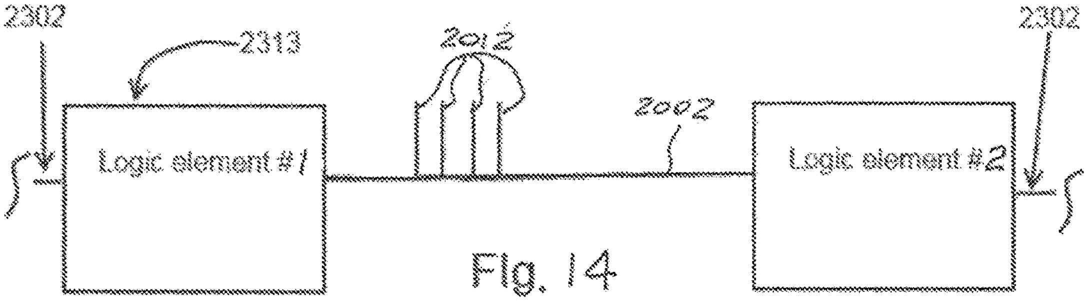
FIG. 14 illustrates an example of a hardware modification of the electronic device of FIGS. 1-2.

FIG. 14 illustrates an example of the pair of logic elements 2313 and 2314 interconnected with each other by the interconnect 2002 modified by a means, such as a plurality of trace elements 2012, spaced apart from each other along a length of the interconnect 2002, where one end of each trace element 2012 is coupled to the interconnect 2002 and an opposite end of each trace element 2012 is not connected to any other logic elements or interconnects.

Figure 15:
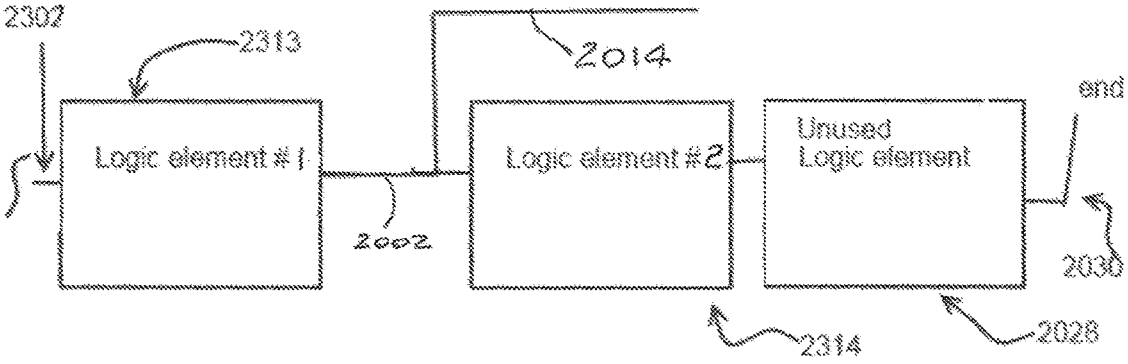
FIG. 15 illustrates an example of a hardware modification of the electronic device of FIGS. 1-2.

FIG. 15 illustrates an example of the pair of logic elements 2313 and 2314 interconnected with each other by the interconnect 2002 modified by a means, such as a single trace element 2014, where one end of the trace element 2014 is coupled to the interconnect 2002 and an opposite end of the trace element 2014 is not connected to any other logic elements or interconnects and forms an antenna. The trace element 2014, illustrated as an L-shaped trace element, can be provided in any other shape, as long as such trace element 2014 only has a connection with the interconnect 2002.

FIG. 15 also illustrates a means such as an unused logic element 2028 whose sole purpose is to create added emissions based on its input signal from logic element 2314 and further provide signal for emissions to an unconnected antenna trace 2030. Logic elements 2313, 2314, 2028 may be of FPGA Combinatorial Logic Block type, discrete logic gates, or even analog components such as amplifiers.

Figure 16:
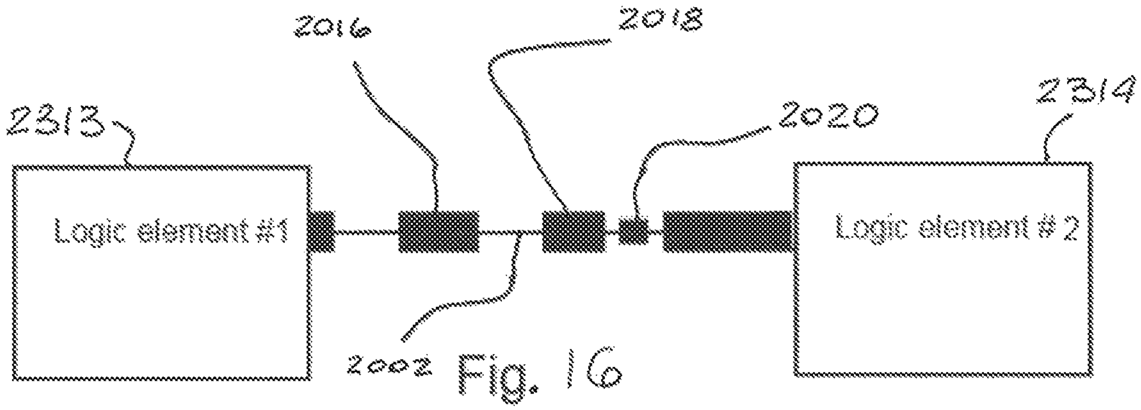
FIG. 16 illustrates an example of a hardware modification of the electronic device of FIGS. 1-2.

FIG. 16 illustrates an example of the pair of existing logic elements 2313 and 2314 interconnected with each other by the interconnect 2002 newly modified a means, such as two or more sections 2016, 2018 and 2020, each with a greater width than a width of the interconnect 2002. It is also contemplated herewithin that increased width of one section 2020 can be smaller than width of one or more other sections 2016, 2018. It is to be understood that a width of an existing (normally specified) interconnect 2002 may be reduced to arrive at the arrangement in FIG. 16.

Figure 17:
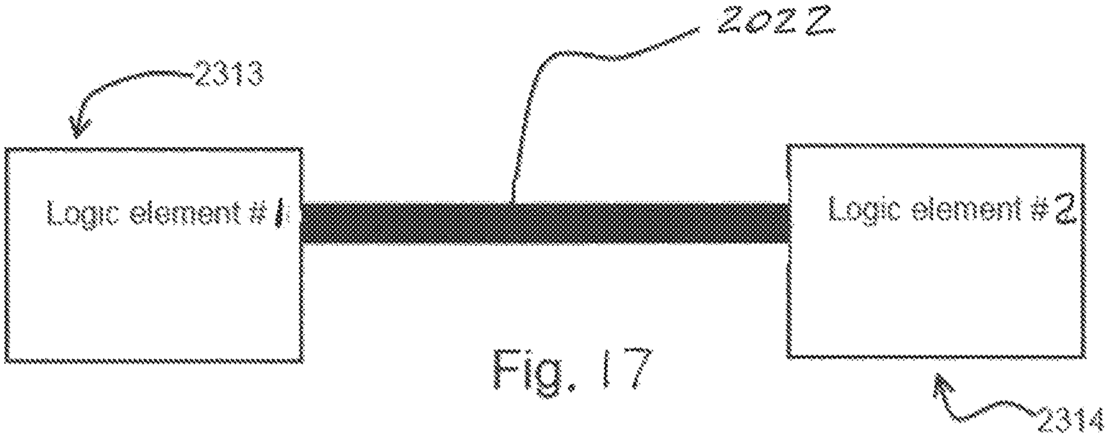
FIG. 17 illustrates an example of a hardware modification of the electronic device of FIGS. 1-2.

FIG. 17 illustrates an example of the pair of existing logic elements 2313 and 2314 interconnected with each other by the interconnect 2002 having a greater width than the original interconnect.

Figure 18:
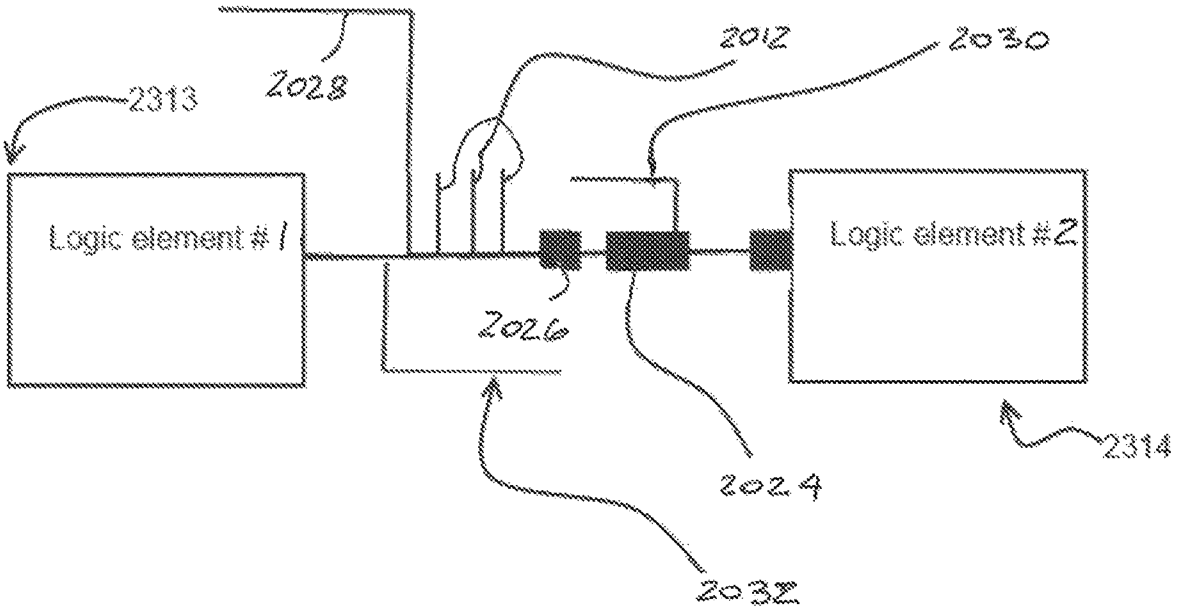
FIG. 18 illustrates an example of a hardware modification of the electronic device of FIGS. 1-2.

FIG. 18 illustrates an example of the pair of existing logic elements 2313 and 2314 interconnected with each other by the interconnect 2002 with a means, such as a new combinatory modification of FIGS. 14-16, defined by a straight trace element 2012, L-shaped elements 2028, 2030 and 2032 and one or more sections 2024, 2026 of increased width. The L-shaped trace element 2030 can be coupled to the increased width portion 2024.

Figure 19:
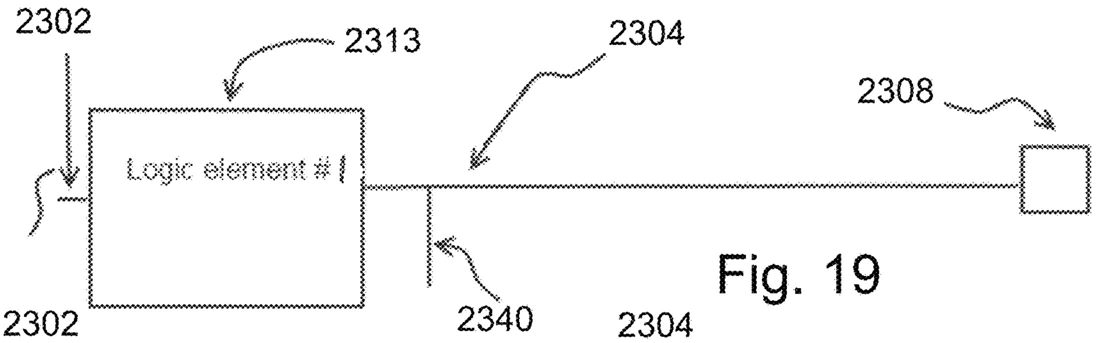
FIG. 19 illustrates an example of a hardware modification of the electronic device of FIGS. 1-2.

FIG. 19 illustrates an example of the logic element 2312 coupled to an I/O pin 2308 with an interconnect 2304. The I/O pin 2308 can be an unused pin during operation of the IC 100. FIG. 19 also illustrates that the interconnect 2304 can be modified by a trace element 2340 where one end of the trace element 2340 is coupled to the interconnect 2002 and an opposite end of the trace element 2340 is not connected to any other logic elements or interconnects.

Figure 20:
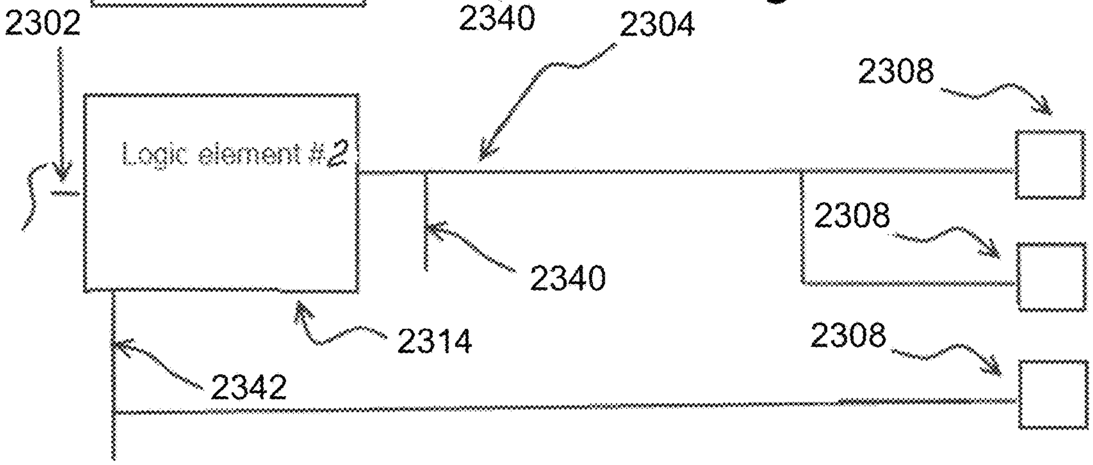
FIG. 20 illustrates an example of a hardware modification of the electronic device of FIGS. 1-2.

FIG. 20 illustrates an example of the logic element 2312 coupled to two or more I/O pins 2308 with an interconnect 2304. The I/O pin 2308 can be an unused pin during operation of the IC 100. FIG. 20 also illustrates that the interconnect 2304 can be modified by a means, such as a trace element 2340 where one end of the element trace 2340 is coupled to the interconnect 2002 and an opposite end of the trace element 2340 is not connected to any other logic elements or interconnects. FIG. 20 further illustrates that a new logic output and new trace element 2342 can be added to the logic element 2314 of the semiconductor device 100. The logic element may be a CLB.

Figure 21:
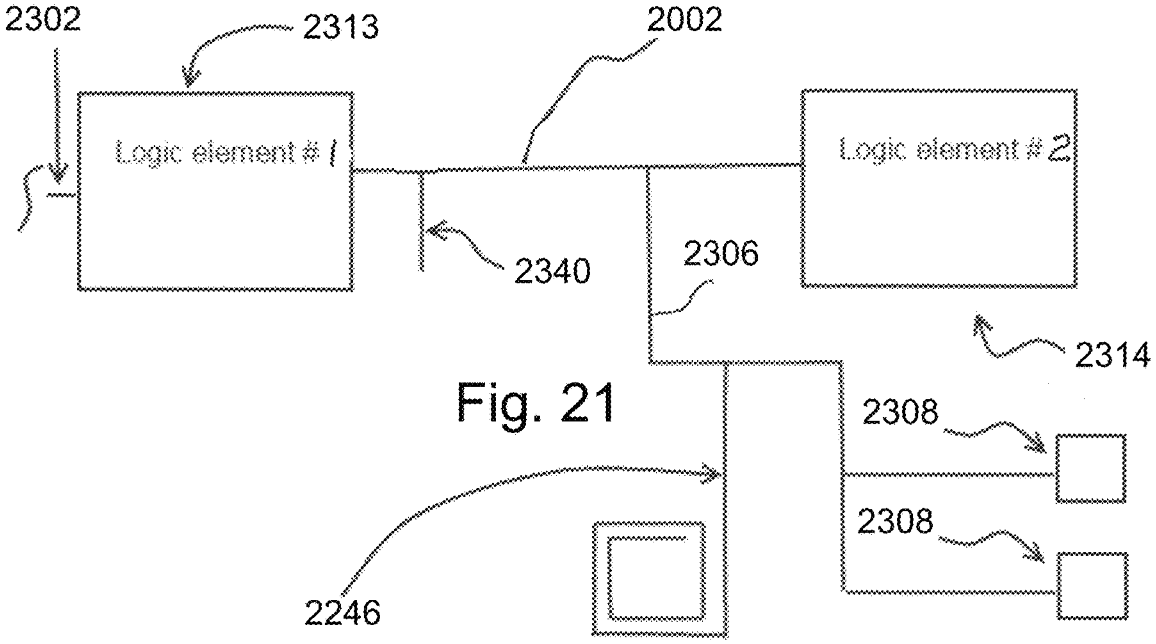
FIG. 21 illustrates an example of a hardware modification of the electronic device of FIGS. 1-2.

FIG. 21 illustrates an example of the pair of existing logic elements 2313 and 2314 interconnected with each other by the interconnect 2002 and with a further new interconnect 2306 with one or more I/O pins 2308. A new trace element 2246 can be added to modify the RF emissions from the IC 100.

Figure 22:
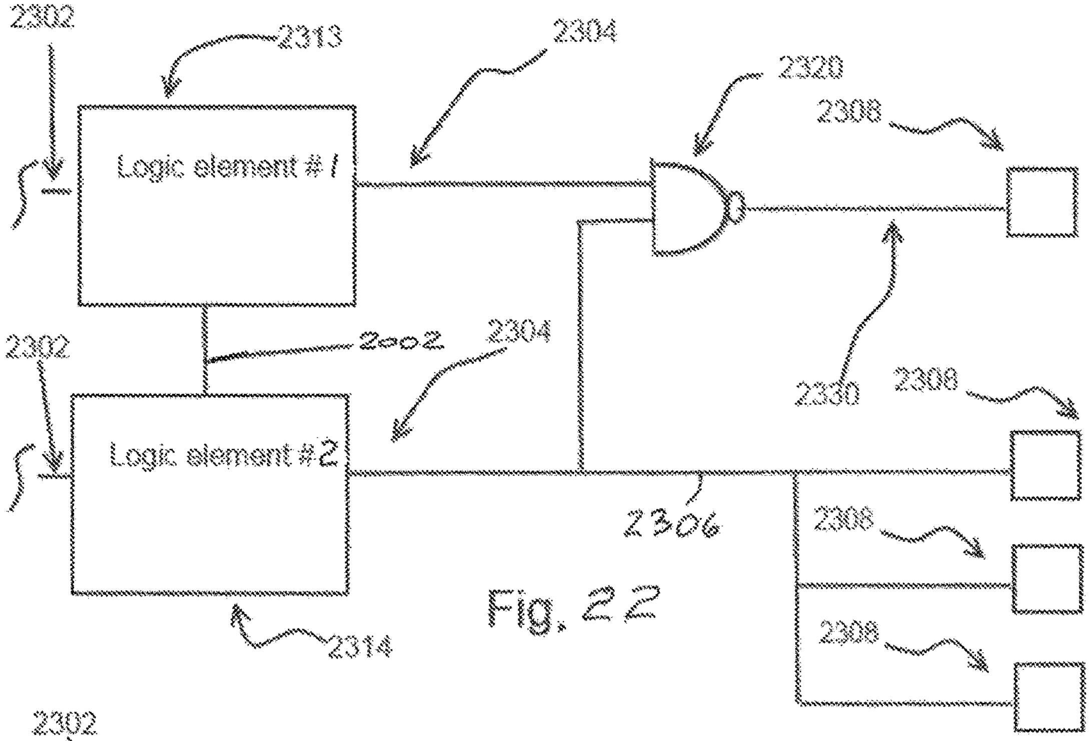
FIG. 22 illustrates an example of a hardware modification of the electronic device of FIGS. 1-2.

FIG. 22 illustrates an example of the existing pair of logic elements 2313 and 2314 such as CLBs interconnected with each other by the existing interconnect 2002 and with a further new interconnect 2306 with one or more I/O pins 2308. Added logic gate 2320 is illustrated as a NAND Gate, but may also be a different logic gate, such as anyone of an Exclusive OR or Exclusive NOR, an AND, a NOR, or OR gate will also generate desired new emissions.

Figure 23:
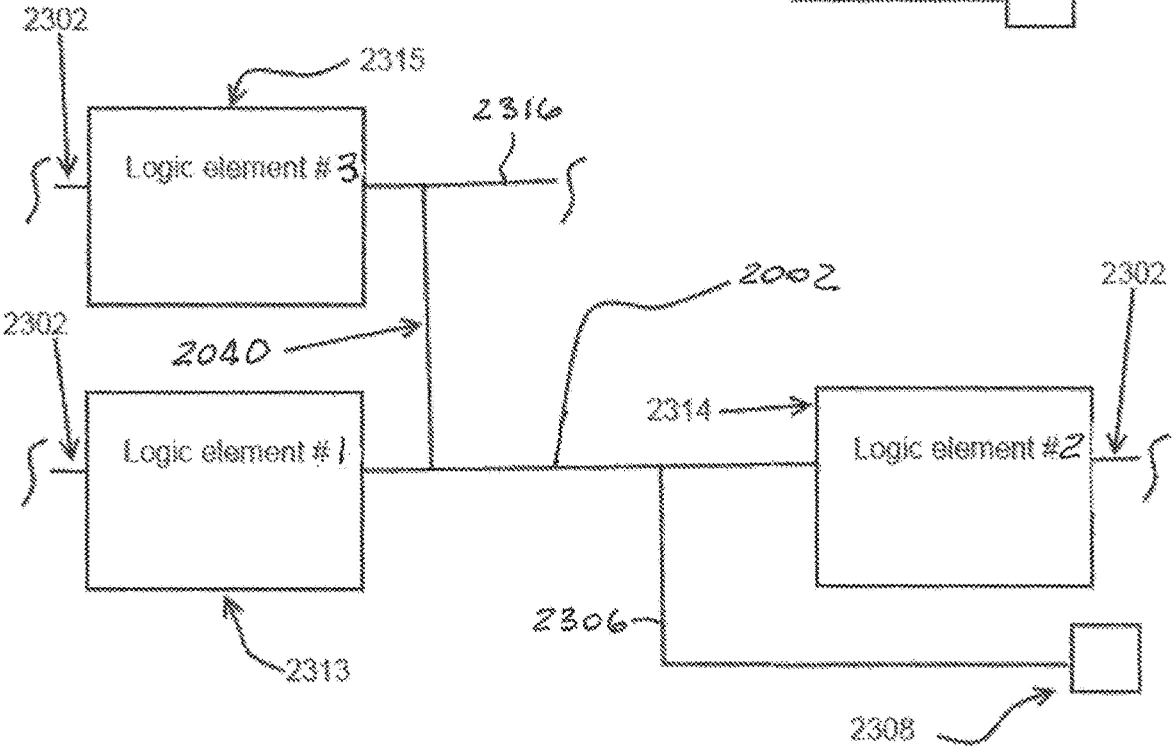
FIG. 23 illustrates an example of a hardware modification of the electronic device of FIGS. 1-2.

FIG. 23 illustrates an example of the pair of existing logic elements 2313 and 2315 interconnected with each other by the interconnect 2340 and with a further new interconnect 2306 with one or more I/O pins 2308. FIG. 23 also illustrates a existing trace element 2002 coupled to an existing logic element 2314.

Figure 24:
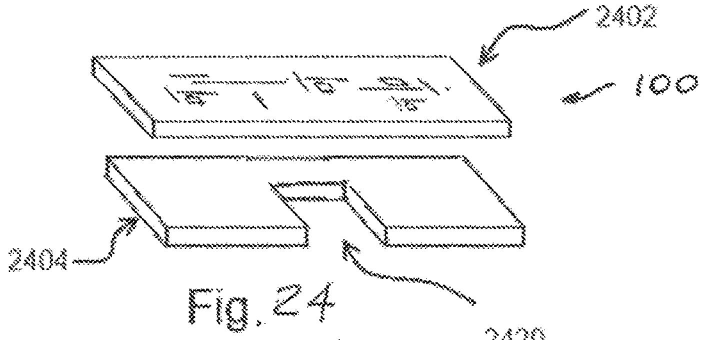
FIG. 24 illustrates an example of a hardware modification of the electronic device of FIGS. 1-2.

FIG. 24 illustrates a means, such as an exemplary circuit die 2402 above a conductive layer 2404 positioned below the die 2402 to influence the emissions from the circuit layer 2402 during operation thereof. A feature, such as notch 2420, can be cut into the conductive layer 2404 to further modify emissions from the circuit layer 2402 without affecting interface or operations of the IC 100.

Figure 25:
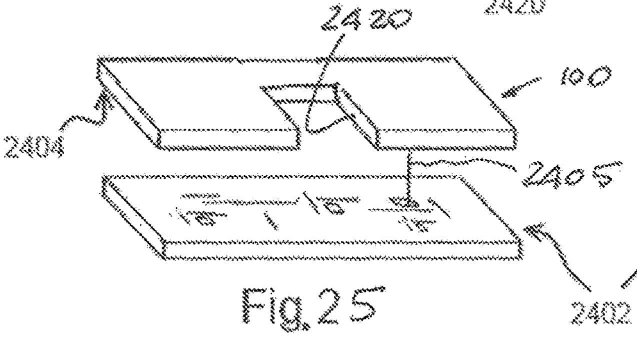
FIG. 25 illustrates an example of a hardware modification of the electronic device of FIGS. 1-2.

FIG. 25 illustrates a means, such as an exemplary circuit layer 2402 below a conductive layer 2404 but connected to the conductive layer 2404 with a new interconnect 2405 to modify the emissions from the circuit layer 2402 during operation thereof.

Figure 26:
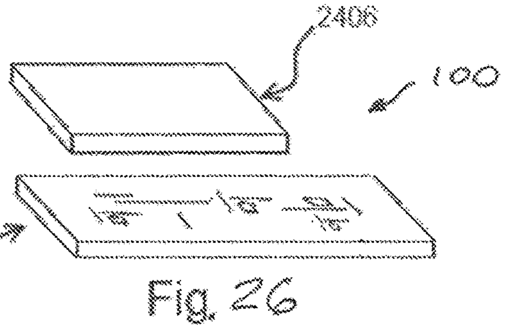
FIG. 26 illustrates an example of a hardware modification of the electronic device of FIGS. 1-2.

FIG. 26 illustrates a means, such as an exemplary circuit layer 2402 below a conductive layer 2406 which is of a different dimension than the above described conductive layer 2404 and modifies the RF emissions differently from the RF emissions modified by conductive layer 2404.

Figure 27:
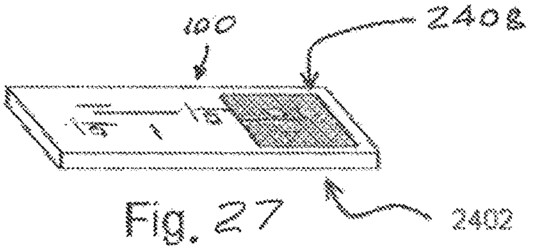
FIG. 27 illustrates an example of a hardware modification of the electronic device of FIGS. 1-2.

FIG. 27 illustrates a means, such as an exemplary circuit layer 2402 containing a region 2408 of modified doping which modifies the emissions from the functional circuit layer 2402.

Figure 28:
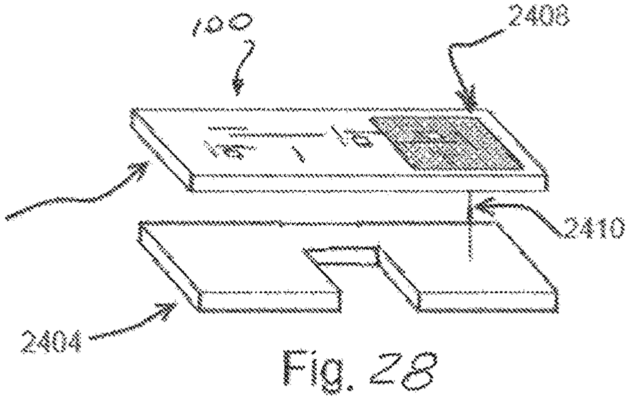
FIG. 28 illustrates an example of a hardware modification of the electronic device of FIGS. 1-2.

FIG. 28 illustrates an exemplary circuit layer 2402 containing a region 2408 of modified doping which modifies the emissions from functional circuit layer 2402. A conductive layer 2404 is also connected to a ground of the circuit layer 2402 with the interconnect 2410, coupling and modifying emission noise in the ground of the circuit layer 2402.

Figure 29:
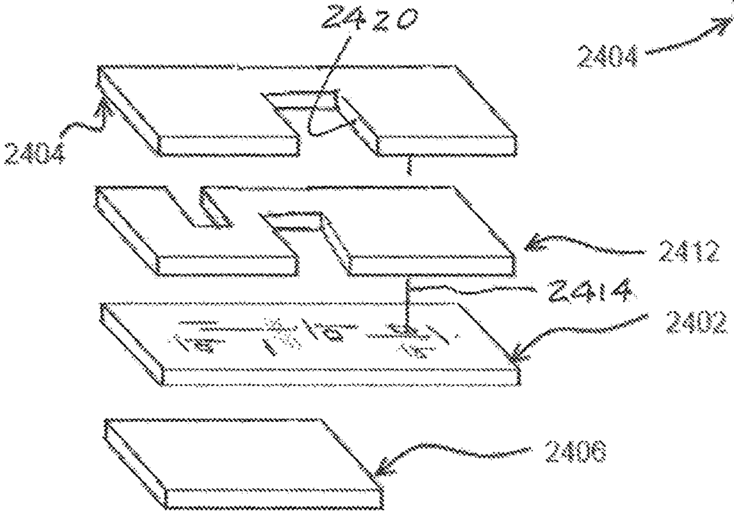
FIG. 29 illustrates an example of a hardware modification of the electronic device of FIGS. 1-2.

FIG. 29 illustrates a means, such as an exemplary circuit layer 2402 whose emissions are further modified by conductive layer 2412 with additional features different from conductive layer 2404 and also conductive layer 2404 further modifying the emissions. A circuit layer 2402 is also connected to conductive plane 2412 with an interconnect to further modify emissions. A conductive layer 2406 is below functional circuit layer 2402 to further modifying the emissions from the circuit layer 2402. It must be noted the vertical distance between 2412, 2402, 2404 and/or 2406 also modify emissions, as does the layer thicknesses.

Figure 30:
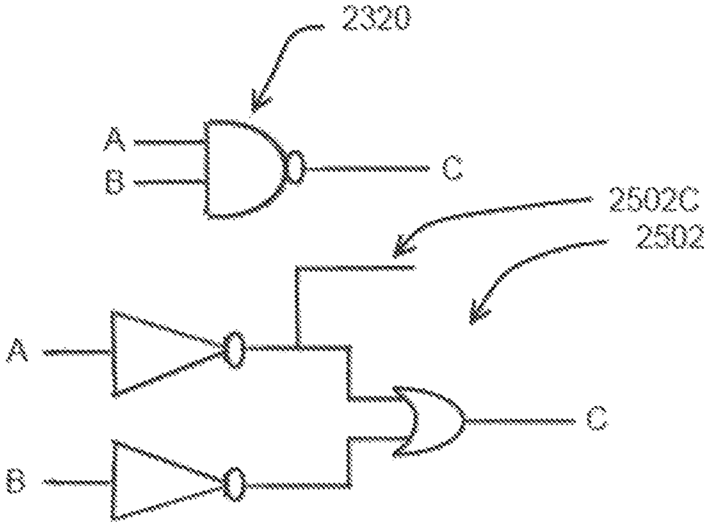
FIG. 30 illustrates an example of a hardware modification of the electronic device of FIGS. 1-2.

FIG. 30 illustrates an example of a substitution of one circuit with a functionally identical but different circuit to change emissions. The original NAND circuit 2320 of FIG. 22 is provided as part of a die. The NAND circuit 2320 can be replaced by a circuit 2502, which is a circuit containing two inverters and a NOR gate. Truth table 2320A defines the sates of NAND circuit 2320 and truth tables 2502A defines the states of the circuit 2502 with two inverters and a NOR gate. As can be seen from the results of both truth tables and as is commonly known to those of ordinary skill in the art, the final results are identical. Region 2320B highlights the truth table results of the NAND gate whereas region 2502B highlights the truth table results of the circuit 2502. Although the results are the same, the intermediate logic functions are different and will result in differing emissions. These differing emissions can be enhanced by a means such as 2502C which represents an antenna stub connected to the output of 2502 circuit inverter A and located on the die. Trace element 2502C may also be connected to or replaced by other means to enhance emissions h as connecting it to an unused I/O pin or a number of antennas.

Figure 31A:
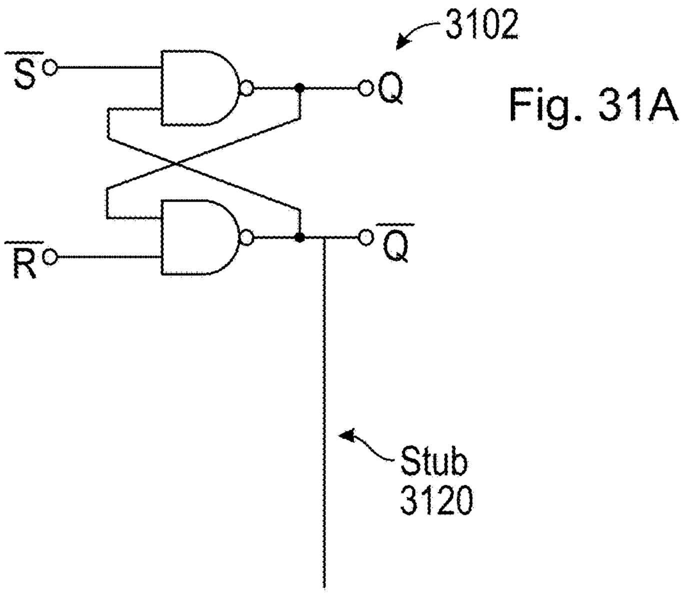
FIGS. 31A-D illustrate an example of a hardware modification of the electronic device of FIGS. 1-2*a* containing an RS Flip-Flop with an emission enhancement antenna stub.
Figure 31B:
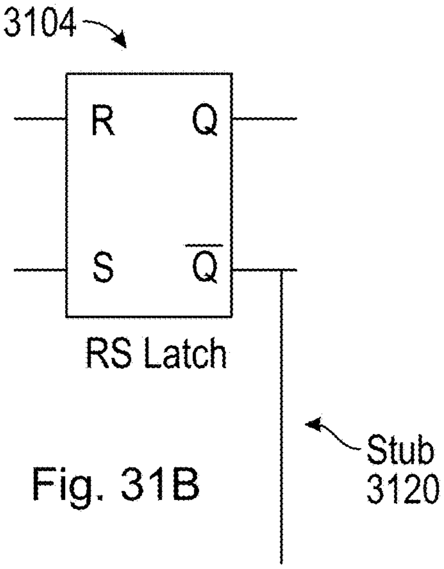
Figure 31C:
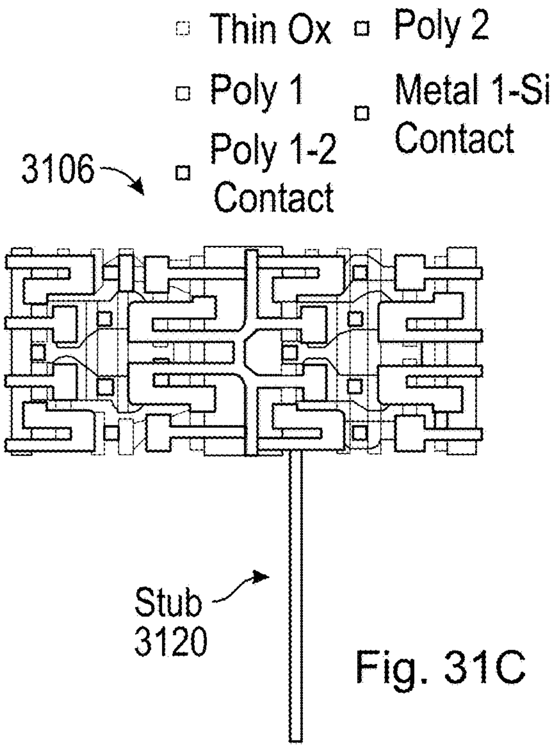
Figure 31D:
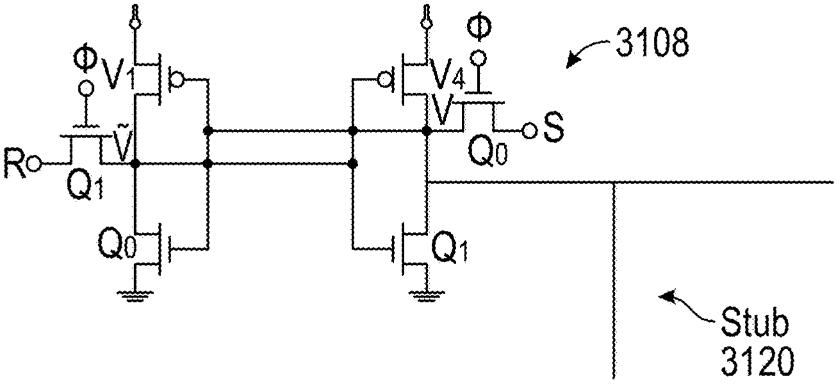

FIGS. 31A-D illustrate an example of a hardware modification of the electronic device of FIGS. 1-2*a* containing an RS Flip-Flop with an emission enhancement antenna stub or circuit element 3102 shown in logic gate format of FIG. 31A, with an emission enhancement antenna stub or circuit element 3108 shown in Mosfet transistor circuit format of FIG. 31B, with an emission enhancement antenna element 3102 shown in higher level logic symbol format of FIG. 31C, and with an emission enhancement antenna stub shown implemented on a gate in a semiconductor die 3106 of FIG. 31D.

Thus, in an embodiment, routing circuit traces within a IC 100 may be used to create antenna structures such as interdigital elements in a distributed element filter to create and/or or enhance the emission energy level frequency characteristics or phase noise of specific emission waveforms.

In a further reference to FIG. 2, the above described trace elements 2012, 2014, 2340, referenced with numeral 262, can be coupled to leads 210, 224 and even to bonding wires 212, 226. Or, any one of the lead 210, 224 or bonding wires 212, 226 can be adapted with portion(s) 260 of increased width.

In a further reference to FIG. 8, the examples of FIGS. 13-30 can be employed to modify RF emissions from a circuit board assembly or even a higher level assembly, for example as the computer 800. In an example, interconnect portion(s) 866 or a greater width can be provided between one or more components. In an example, a trace element 862 or 868 can be coupled to one or more interconnects. In an example, trace elements 864 can be coupled, at one end thereof and in a spaced apparat apart relationship with each other to one or more interconnects.

Figure 8A:
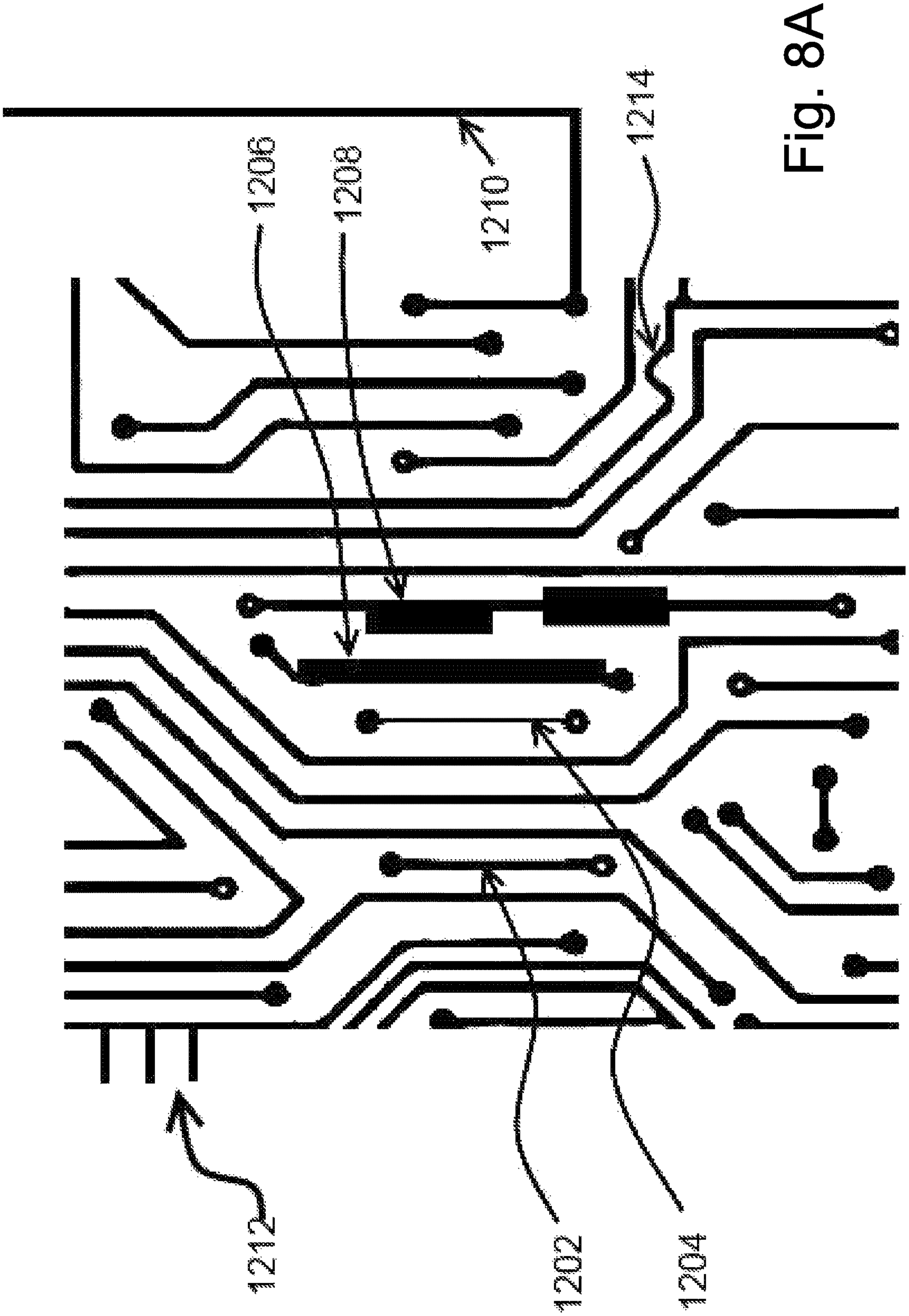
FIG. 8A illustrates an exemplary embodiment wherein the electromagnetic emission is generated by modification(s) to a printed circuit board (PCB)

FIG. 8A illustrates a printed circuit board (PCB) modified with examples of FIGS. 13-23. More specifically, new traces 1202, 1204 can be added to the PCB. One or more traces can be adapted with portions or regions 1206, 1208 with a greater width. One or more trace can be modified with a shaped region 1214. One or more trace elements 1212 can be coupled to one or more existing traces.

In an embodiment, routing circuit interconnects to pins that are then specifically to be pulled up or pulled down can be used to create new signature features influenced by the increased electrical path length and to increase the amplitude of emissions in general. The added electrical length may thus be sufficient to create additional peaks at multiple frequencies which are of sufficient strength to rise above the receiver's noise floor.

In an embodiment, a group of circuit interconnects and a group of pins may be newly combined by logical functions, for example such as And or Or, and the resulting output be newly used to drive a single pin. Alternatively, they may separately be connected to corresponding separate unused I/O pins. Alternatively, one or more may separately be connected to multiple corresponding separate unused I/O pins.

In an embodiment, narrowing or broadening of circuit interconnects will affect the frequency width of emission peak structures, which naturally occurs due to electromigration. This same modification of emission signature elements can be achieved by purposefully modifying the interconnect traces with a broadened or narrowed interconnect between components, Combinatorial Logic Blocks, gates, or other devices on the IC 100.

In an embodiment, modifying patterns of narrower and/or broader sections within one or more interconnects with varying widths will create a unique emission pattern due to rapid changes in interconnects impedance as a signal travels down its length.

In an embodiment, modifying the doping of individual gates or patterns of gates within the IC 100 may be used to affect their timing and thus modify the frequency and amplitude envelope of emitted non-linear mixing products.

In an embodiment, narrow trace elements may be placed along the length of circuit interconnects, much like whiskers, where the physical spacing of the trace elements and their width will cause emissions with controllable waveforms.

In an embodiment, semiconductor device packaging may be modified to alter the frequency or amplitude of existing emissions or introduce new emission signature elements through the placing of a conductive layers on the inner top surface or bottom surface of the packaging.

In an embodiment, the conductive layer can be patterned to further modify emission signatures such as a varied layer thickness, added voids or cutouts in the layer or differing edge geometries and shapes of the layer.

In an embodiment, multiple such layers may be overlapped and placed in an offset pattern to further modify emissions.

In an embodiment, one or more layers may further be connected to one or more unused I/O pins which could be either tied up or down, and/or to unused I/O pins connected to circuit interconnects or to gates to modify emissions.

In an embodiment, different technology nodes can be utilized to introduce features with distinct that emit energy characteristic(s) that can be detected and differentiated by an electromagnetic emission sensor, for an example such as the apparatus 180. The technology node (also process node, process technology or simply node) is traditionally defined as the smallest half-pitch of contacted metal 1 lines allowed in the fabrication process. It is a common metric used to describe and differentiate the technologies used in fabricating integrated circuits. Different nodes often imply different circuit generations and architectures. Generally, the smaller the technology node means the smaller the feature size, producing smaller transistors which are both faster and use less power. Most recently, due to various marketing and discrepancies among foundries, the number itself has lost the exact meaning it once held. Recent technology nodes such as 45 nm, 32 nm, 22 nm, 16 nm, 14 nm, and 10 nm refer purely to a specific generation of chips made in a particular technology. Circuit elements of different sizes may not change designed functionality and/or designed interfaces of an electronic device but will change characteristics of the emitted electromagnetic energy.

In an embodiment, the electronic device(s) or the method(s) utilize different technology node processing techniques to introduce specific internal die circuit characteristics that can be controlled to change non-functional or redundant parts of the circuit to provide a customized emission output that can be used for at least one of authentication, characterization, the embedding of information, intellectual property watermarking, hardware revisions, program states, or device lineage. Non-limiting examples of such processing techniques comprise a thinner gate dielectric (thinner oxide layer), different doping concentrations, different control(s) of impurities in type and concentration, different oxidation reaction for dielectric creation, different etching methods, different temperature and processing times for impurity diffusions, use of different dopants, use of ion implantation instead of diffusion.

In an embodiment, the electronic device(s) or the method (s) utilize means, features, techniques or steps that evolve over time such that the measurement of such features can be utilized to measure the time that the die, IC, PCB, PCB assembly, or a higher level electronic device has been in use. A non-limiting example comprises implementation of features that are narrow enough that the impedance changes over time the circuit is in use. In one non-example, a trace carrying a specified current can be narrower than conventionally used so that it degrades faster. In another non-limiting example, a radioactive active element can be integrated into at least a portion of the die or dopant. This specifically designed feature is built into the device so that the emission caused by electrons flowing through said feature changes in a known way as an aggregated amount of current flows through it over a given amount of time. Likewise, the feature can be designed that breaks down or degrades incrementally as voltage is intermittently applied over time.

In an embodiment, an electronic device can comprise one or more sets or regions of one or more radioactive elements may be integrated into all of, a portion of, a set of gates of, multiple sections of, a section of, or a gate of the substrate, die, feature, dopant, interconnect, dielectric insulator or MEMS element such that its properties change at a specifiable and highly controlled decay rate as the element changes to another element.

In an embodiment, an electronic device can comprise a dielectric insulator constructed to gradually become more insulating or less insulating, as the resistance of an interconnect, or the gain of a gate element. This then will cause needed emission changes over the desired time period.

In an embodiment, an electronic device can comprise multiple elements and/or isotopes with differing decay rates to craft the decay curve response and corresponding emission changes.

In an embodiment, an electronic device or method can comprise ion implantation using specific radioactive or nonradioactive isotope concentrations to accurately and selectively achieve the specifically desired radioactive or nonradioactive element and isotope concentration levels and associated electrical and emissions outcomes over device lifetime.

In an embodiment, electronic device(s) or the method(s) comprise feature(s), technique(s) or step(s) that change or fail catastrophically based on the use characteristics of the electronic device. Such failure of the microstructure(s) does not necessarily cause failure of the electronic device, but provides an indication that an event, for examples such as an Electrostatic Discharge (ESD), a radiation dose, a temperature exposure out of specification, a pressure, a humidity, or a chemical exposure has occurred.

In an embodiment, electronic device(s) can comprise a fuse (not shown) that can be coupled to lead 210 and that can be configured to be susceptible to the environmental effect (s), such that a previously radiating designed-in feature was turned off or a previously non-radiating designed-in feature was turned on via the fuse.

In an embodiment, electronic device(s) comprise a fuse (not shown) that is configured to convey, via designed-in radiating features, a wide range of characteristics of the electronic device that are at least one of a permanent, an intermittent, a gradual, an event-driven, a Boolean (on or off) or a temporary.

In an embodiment, the electronic device comprises one or more Micro ElectroMechanical System (MEMS) sensors that are at least one of integrated with at least one of a die or IC, wherein said MEMS indications can be translated into features that result in electromagnetic emissions with distinct characteristics such that these emissions can be detected by an external sensor.

In an embodiment, MEMS sensors disposed external to the die or IC wherein the MEMS indications or electronic signals from MEMS and conveyed thru unused input pins to emission circuitry provide a higher level of measurement acuity that can be characteristically conveyed to a sensor or an apparatus that is measuring the electromagnetic emissions of the electronic device in a non-contact manner.

In an embodiment, a semiconductor device comprises a semiconductor substrate; one or more circuits disposed on the substrate; semiconductor and a means for modifying, without changing a designed interface functionality of the semiconductor device, characteristic(s) of an electromagnetic energy emittable from the semiconductor device.

A feature of this embodiment is that the means comprises one or more trace elements within the one or more circuits, each of the one or more trace elements with one end thereof being directly coupled to interconnect between two circuit elements within the one or more circuits and with an opposite end thereof being terminated without coupling to any one of trace(s) between circuit elements within the one or more circuits.

A feature of this embodiment is that the means comprises trace elements spaced at a predetermined distance from each other along a length of at least one circuit interconnect, each of the trace elements with one end thereof being directly coupled to the at least one interconnect and with an opposite end thereof being terminated without coupling to any one of interconnect(s) between circuit elements within the one or more circuits.

A feature of this embodiment is that the means comprises at least one interconnect between at least a pair of circuit elements in the semiconductor device, the at least one interconnect with one or more regions of a smaller or larger the width, one or affecting more regions width of peak structure(s) of emitted electromagnetic energy.

A feature of this embodiment is that the means comprises one or more interconnect with a varying width, the varying width modifying impedance of the one or more interconnect.

A feature of this embodiment is that the means comprises a modification or doping of gate(s) and/or pattern(s) of gates within the semiconductor device resulting in a timing change of the gate(s) and/or the pattern(s) of gates, the timing change modifying frequency and amplitude envelope of non-linear mixing products.

A feature of this embodiment is that the means comprises at least one trace element coupling at least one circuit element in the circuit with an unused I/O pin in the semiconductor device.

A feature of this embodiment is that the means comprises at least one interconnect between at least two circuit elements in the semiconductor device, with one or more regions of a smaller or larger width, the one or more regions affecting width of peak structure(s) of emitted electromagnetic energy; and one or more trace elements within the one or more circuits, each of the one or more trace elements with one end thereof being directly coupled to the one or more regions of a smaller or larger width and with an opposite end thereof being terminated without coupling to any one of trace(s) between circuit elements within the one or more circuits.

A feature of this embodiment is that the means comprises one or more trace elements within the one or more circuits, each of the one or more trace elements with one end thereof being directly coupled to an interconnect between two circuit elements within the one or more circuits and with an opposite end thereof being terminated without coupling to any one of interconnect(s) between circuit elements within the one or more circuits; one or more region in one or more interconnects between circuit elements, the one or more region with a different width than a remaining portion of the one or more interconnect; and at least one trace element coupling at least one circuit element in the circuit with an unused I/O pin in the semiconductor device.

A feature of this embodiment is that the means comprises a doping region in one or more layers of the semiconductor device, the doping region configured to change the characteristic(s) of the electromagnetic energy emittable from the semiconductor device.

A feature of this embodiment is that the doping region is on a layer carrying the one or more circuits thereon.

A feature of this embodiment is that the means comprises a notch in a conductive layer in the semiconductor device, the notch configured to change the characteristic(s) of the electromagnetic energy emittable from the semiconductor device.

A feature of this embodiment is that the means comprises a change in conductor composition, changing the electron velocity within the conductor and modifying the circuit timing.

A feature of this embodiment is that the means comprises an interconnect between a conductive layer and a layer carrying the one or more circuits, the interconnect configured to change the characteristic(s) of the electromagnetic energy emittable from the semiconductor device.

A feature of this embodiment is that the means comprises a conductive layer positioned above or below a layer carrying the more circuits thereon, the conductive layer having a one or smaller size than a size of the layer carrying the one or more circuits thereon.

A feature of this embodiment is that the means comprises a conductive layer positioned above a layer carrying the one or more circuits thereon, the conductive layer comprising a notch; a conductive layer positioned below the layer carrying the one or more circuits thereon, the conductive layer having a smaller size than a size of the layer carrying the one or more circuits thereon; and an interconnect between the layer carrying the one or more circuits thereon and the conductive layer positioned below the layer carrying the one or more circuits thereon.

A feature of this embodiment is that the means comprises replacement of one circuit logic element with another circuit logic element changing an intermediate logic function(s) without changing end logic function(s).

In an embodiment, a method of authenticating an electronic device comprises the steps of modifying any one of a software, hardware or firmware of the electronic device to generate emissions of electromagnetic energy with one or more preselected characteristics; connecting the electronic device to at least a supply of operating voltage; receiving, with an antenna coupled to a receiver, the emissions of the electromagnetic energy; and determining, with a control unit, in a response to received emissions of the electromagnetic energy a presence of the one or more preselected characteristics.

In an embodiment, a method of marking a semiconductor device comprises the steps of modifying, without changing a designed interface functionality of the semiconductor device, a structure of the semiconductor device to emit preselected characteristic(s) of an electromagnetic energy; operating the semiconductor device to emit the electromagnetic energy; and confirming, with a control unit, a presence of the preselected characteristic(s) in a response to a receipt of emitted electromagnetic energy.

In an embodiment, a method of authenticating an electronic device, comprising a processor that executes a program, comprises the steps of acquiring a source code in the program; modifying one or more portions of the source code; compiling a new program with the modified source code; executing the new program; emitting electromagnetic energy from the electronic device during execution of the program, the electromagnetic energy with characteristic(s) associated with the one or more modified portions of the source code; and authenticating the electronic device in a response to a receipt of the emitted electromagnetic energy the characteristic(s) associated with the one or more modified portions of the source code.

In an embodiment, a method of authenticating an electronic device, comprising a processor that executes a program, comprises the steps of acquiring a source code in the program; modifying one or more portions of the source code; and compiling a new program with the modified source code;

In an embodiment, a method of authenticating an electronic device, comprising a processor that executes a program, comprises the steps of acquiring a source code in the program; modifying one or more portions of the source code; compiling a new program with the modified source code; executing the new program; emitting electromagnetic energy from the electronic device during execution of the program, the electromagnetic energy with characteristic(s) associated with the one or more modified portions of the source code; and authenticating the electronic device in a response to a receipt of the emitted electromagnetic energy with the characteristic(s) associated with the one or more modified portions of the source code.

In an embodiment, a method of authenticating a semiconductor device comprises the steps of acquiring a design of the semiconductor device; modifying one or more portions of the semiconductor device; manufacturing a new die containing the one or more modified portions; connecting power and clock signals to the semiconductor device; emitting electromagnetic energy from the semiconductor in a response to the power and clock signals, the electromagnetic energy with characteristic(s) associated with the one or more modified portions of the semiconductor device; and authenticating the electronic device in a response to a receipt of the emitted electromagnetic energy with the characteristic(s) associated with the one or more modified portions of the semiconductor device.

In an embodiment, a method of authenticating a semiconductor device comprises the steps of acquiring a design of the semiconductor device; modifying one or more portions of the semiconductor device; manufacturing a new die containing the one or more modified portions; and packaging the new die into an electronic device.

In an embodiment, a non-transitory computer readable recording medium has recorded thereon a program for executing any of the above methods.

In an embodiment, a system for authenticating an electronic device comprises a means for modifying, without changing a designed interface functionality of the electronic device, characteristic(s) of an electromagnetic energy emittable from the electronic device; an antenna configured to acquire the electromagnetic energy signal emitted from the electronic device; a receiver coupled to the antenna and configured to convert the acquired electromagnetic energy signal into a digital form; and a control unit coupled to the receiver, the control unit configured to process the converted electromagnetic energy signal and identify the characteristic(s).

In an embodiment, an apparatus for authenticating an electronic device comprises an antenna configured to acquire the electromagnetic energy signal emitted from the electronic device; a receiver coupled to the antenna and configured to convert the acquired electromagnetic energy signal into a digital form; and a control unit coupled to the receiver, the control unit configured to process the converted electromagnetic energy signal and identify characteristic(s) of the electromagnetic energy due to a modification of the electronic device in a manner that does not change a designed interface functionality of the electronic device.

A feature of this embodiment is that the control unit comprises one or more processors; and a non-transitory computer readable medium comprising executable instructions that, when executed by the one or more processors, cause the one or more processors to identify the characteristic(s).

In an embodiment, a printed circuit board (PCB) assembly comprises a PCB; one or more electronic devices mounted on the PCB; interconnects between the one or more electronic device; and a means for modifying, without changing a designed interface functionality of the PCB assembly, characteristic(s) of an electromagnetic energy emittable from the PCB assembly.

A feature of this embodiment is that the means comprises one or more trace elements within the one or more electronic device, each of the one or more trace elements with one end thereof being directly coupled to an interconnect between two circuit elements within the one or more electronic device and with an opposite end thereof being terminated without coupling to any one of interconnect(s) between circuit elements within the one or more electronic device.

A feature of this embodiment is that the means comprises trace elements spaced at a predetermined distance from each other along a length of the interconnect(s), each of the trace elements with one end thereof being directly coupled to an interconnect between two electronic devices and with an opposite end thereof being terminated without coupling to any one of interconnect(s) between the one or more electronic devices.

A feature of this embodiment is that the means comprises one or more of from the interconnects with one or more regions of a smaller or larger width, the one or more regions affecting width of peak structure(s) of emitted electromagnetic energy.

A feature of this embodiment is that the means comprises one or more interconnects with a varying width, the varying width modifying impedance of the one or more trace.

A feature of this embodiment is that the means comprises a modification or doping of gate(s) and/or pattern(s) of gates within the one or more electronic devices resulting in a timing change of the gate(s) and/or the pattern(s) of gates, the timing change modifying frequency and amplitude envelope of non-linear mixing products.

A feature of this embodiment is that the means comprises at least one trace element coupling at least one electronic device in the circuit with an unused I/O connection on the PCB.

A feature of this embodiment is that the means comprises one or more interconnects with one or more regions of a smaller or larger width, the one or more regions affecting width of peak structure(s) of emitted electromagnetic energy; and one or more trace elements on the PCB, each of the one or more trace elements with one end thereof being directly coupled to the one or more regions of a smaller or larger width and with an opposite end thereof being terminated without coupling to any one of interconnect(s) between the one or more electronic devices.

A feature of this embodiment is that the means comprises one or more trace elements within on the PCB, each of the one or more trace elements with one end thereof being directly coupled to an interconnect between two electronic devices and with an opposite end thereof being terminated without coupling to any one of interconnect between the electronic devices; one or more region in one or more interconnect between a pair of electronic devices, the one or more region with a different width than a remaining portion of the one or more interconnect; and at least one trace element coupling at least one electronic device with an unused I/O connection on the PCB.

In an embodiment, an electronic device comprises one or more printed circuit board (PCB) assemblies, each comprising a PCB, electronic devices mounted on the PCB, and interconnects between the one or more electronic device; and a means for modifying, without changing a designed interface functionality of the PCB assembly, characteristic(s) of an electromagnetic energy emittable from the electronic device.

In an embodiment, an integrated circuit (IC) device comprises a casing; one or more input/output connections on or extending from an interior surface of the casing; one or more dies within the casing; leads between the one or more die and the one or more input/output connections; boding wires, each coupling each lead to the one or more die; and a means for modifying, without changing a designed interface functionality of the IC, characteristic(s) of an electromagnetic energy emittable from the IC.

A feature of this embodiment is that the means comprises one or more trace elements, each of the one or more trace elements with one end thereof being directly coupled to a lead and with an opposite end thereof being terminated without coupling to any one of leads.

A feature of this embodiment is that the means comprises one or more trace elements, each of the one or more trace elements with one end thereof being directly coupled to a bonding wire and with an opposite end thereof being terminated without coupling to any one of bonding wires.

A feature of this embodiment is that the means comprises trace elements spaced at a predetermined distance from each other along a length of at least one lead, each of the trace elements with one end thereof being directly coupled to the at least one lead and with an opposite end thereof being terminated without coupling to any one of leads.

A feature of this embodiment is that the means comprises at least one lead with one or more regions of a smaller or larger width, the one or more regions affecting width of peak structure(s) of emitted electromagnetic energy.

A feature of this embodiment is that the means comprises one or more leads with a varying width, the varying width modifying impedance of the one or more interconnect.

A feature of this embodiment is that the means comprises one or more bonding wires with a varying width, the varying width modifying impedance of the one or more interconnect.

A feature of this embodiment is that the means comprises a modification or doping of gate(s) and/or pattern(s) of gates within the one or more dies resulting in a timing change of the gate(s) and/or the pattern(s) of gates, the timing change modifying frequency and amplitude envelope of non-linear mixing products.

In an embodiment, a method is provided for identifying a software change or a software tampering within a central processing unit (CPU), the method comprises the steps of placing a software RF emission element within a software execution loop; periodicity measuring the software RF emission element to determine an execution time of the software execution loop between RF emission periodic signals; measuring a difference between the determined execution time and a threshold; and determining the software change or tempering based on the measured difference.

The above described exemplary embodiments take advantage of the fact that low-level emissions of a high degree of complexity and potential encoded data content can be generated using no additional cost and little added CPU time, silicon area, or FPGA gates.

In an embodiment, a chip comprises individual circuits whose conductive or insulative circuit features are modified by one or more radioactive isotopes in one or more locations to modify the function of the chip or one or more of its circuits so that its operation is irrevocably time controlled to enable, enhance, degrade or disable circuit capabilities or functionality before, after or during a pre-specified time period.

In an example, a gate dielectric insulator may be doped via ion beam deposition and ion beam focus and selection for deposition in a very specific region or regions with a radioactive isotope of sufficient concentration, half-life and particle charge characteristic (electron, positron, electron capture, etc.) to change the gate from a non-functioning gate for approximately 6 months to a functioning gate approximately 6 months after manufacture. Thus, the chip or chip feature may not be functional until a specified period of time has elapsed. Further, a different element or isotope may be doped into the gate dielectric insulator to degrade or change elements far more slowly, for example such that after approximately 5 years the gate may again become non-functional. The function, chip or feature relying on that gate is thus available for a specific duration, a specific start time and specific stop time. This creates a self-disabling feature and capability in electronic devices.

The above can separately be placed on various gates, regions, conductors, MEMS sensors, insulators to selectively enable and/or disable them at pre-specified times. Elements and isotopes selected may create characteristics such as but not limited to increased insulating, increased conducting, or more chemically degrading characteristics into any or all constituent components of a die.

In an example, a light sensor may be pre-deposited or pre-doped with a isotope creating electric noise via beta decay that severely limits its vision capability during the first half-life of 2 months of the isotope, becoming gradually usable and considered fully usable after 6 months.

In an example, the needed doping concentration may only gradually 'appear' as the deposited isotope decays into the useful needed doping element needed for circuit operation. Alternatively, the needed doping concentration may be configured to gradually radioactively decay rendering the gate gradually useless. The doping in the circuitry and the circuitry design may be configured to thus automatically switch over to a different functioning similar or functioning circuit with different, greater or fewer features at and/or during a pre-specified time period. Proper selection of elements, isotopes, half-lives within circuits, gates and chip design allow for unlimited capability sequencing or options available.

The above examples also provide a means for modifying conductive or insulative circuit features of one or more circuits of the chip by one or more radioactive isotopes in one or more locations to modify the function of the chip or one or more of its circuits so that its operation is irrevocably time controlled to enable, enhance, degrade or disable circuit capabilities or functionality before, after or during a pre-specified time period.

The above examples also define method(s) for modifying conductive or insulative circuit features of one or more circuits of the chip by one or more radioactive isotopes in one or more locations to modify the function of the chip or one or more of its circuits so that its operation is irrevocably time controlled to enable, enhance, degrade or disable circuit capabilities or functionality before, after or during a pre-specified time period.

The above described exemplary embodiments promulgate speed of the semiconductor device modification, by essentially minimizing additional hardware design. Further, existing hardware specifications need not be scrutinized and adhered to, in adding the RF transmit embodiments disclosed herein. In typical common known designs hardware where transmitter functionality is added or retrofitted, additional hardware can be specifically chosen based on electrical, mechanical, cost, and physical specifications and constraints. The design time required conforming to those constraints and interface to the additional hardware is significantly higher than the method and apparatus described in the instant invention.

The above described exemplary embodiments quickly allow the construction of a means to transmit states or data from deep within a program, semiconductor logic device, or FPGA, without the typical need for logic conveyance of the data to peripheral output signal physical hardware lines and the output of the signals on an established medium, in an established format, at an established frequency, or other typically necessary details. The state information or data can be transmitted with a minimum of effort, from anywhere within a program or hardware device, and indicative of any state, memory or register variable value, hardware module activity, software module activity, software module being called, hardware module being enabled or the like. As such, the instant invention may also be a useful tool for debugging firmware or hardware. As an example, RF emission elements can be deliberately placed to be activated or deactivated depending on the initialization state, sequence, or code section being executed. As a more specific example, deliberately placed RF emission elements may be easily and/or quickly placed in various device drivers or bootstrap code elements, indicating sequence of operations or milestones reached in the process, thus being activated substantially in sequence as a system bootup or startup progresses. Should the time gap(s) between one expected RF emission element and a second or series of RF emission startup elements be prolonged, not be in the expected order, or not occur at the expected timing separations, indications of a software problem, software change, hardware problem, or even software or hardware version may be received. In this manner, diagnostics may be embedded into software, firmware or hardware without requiring use, maintenance or allocation of additional system resources, and without necessarily requiring interface to external software or hardware elements for the communication of those states or state transitions such as a logging area in memory or on disk. Another advantage of this approach is the platform independence capability in some cases, as the same source code or VHDL code may be compiled on any system or from any FPGA. The specific new emission frequencies, shapes, profiles, envelopes and/or signatures generated may vary to a degree between systems (ex. Linux, Android, Apple IOS, or Windows) and/or between hardware platforms (Intel or AMD, Xilinx or Lattice), but the individually distinct and discernable patterns created would remain present, locatable and useful.

In an embodiment, any of the above described methods can be implemented in the form of software stored on a computer-readable non-transitory information storage medium such as an optical or magnetic disk, a non-volatile memory (e.g., Flash or ROM), RAM, and other forms of volatile memory. The information storage medium may be an internal part of the computer, a removable external element coupled to the computer, or unit that is remotely accessible via a wired or wireless network.

In an embodiment, any of the above described methods can be written (or take form) as a computer program and can be implemented in general-use digital computers that execute the programs using a computer readable storage and/or recording medium. In addition, the structure of data used in the method can be written on a computer readable recording medium by using several units. Examples of the computer readable storage and/or recording medium include magnetic storage media (e.g., ROM, RAM, USB, floppy disks, hard disks, etc.), optical recording media (e.g., CD-ROMs, or DVDs), PC interface (e.g., PCI, PCI-express, WiFi, etc.), etc. In other words, in the context of this document, a computer readable storage and/or recording medium may be any tangible medium that can contain, or store a program and/or data for use by or in connection with an instruction execution system, apparatus, or device.

Any combination of one or more computer readable storage medium(s) may be utilized. A computer readable storage medium may be embodied as, for example, an electronic, magnetic, optical, electromagnetic, infrared, or semiconductor system, apparatus, or device, or other like storage devices known to those of ordinary skill in the art, or any suitable combination of computer readable storage mediums described herein.

In an embodiment, the computer may comprise the receiver 118.

In an embodiment, any of the above described methods can be implemented by single or multiple algorithms.

Persons of ordinary skill in the art may appreciate that, in combination with the examples described in the embodiments herein, units algorithm and steps can be implemented by electronic hardware, computer software, or a combination thereof. In order to clearly describe the interchangeability between the hardware and the software, compositions and steps of every embodiment have been generally described according to functions in the foregoing description. Whether these functions are performed using hardware or software depends on particular applications and design constraints of the technical solutions. A person skilled in the art may use different methods to implement the described functions for each specific application. However, such implementation should not be considered as beyond the scope of the present invention. As an example, the same circuit modifications may be made in an ASIC, FPGA, or custom logic device.

Computer program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Many of the elements described in the disclosed embodiments may be implemented as modules. A module is defined here as an isolatable element that performs a defined function and has a defined interface to other elements. The modules described in this disclosure may be implemented in hardware, software in combination with hardware, firmware, wetware (i.e hardware with a biological element) or a combination thereof, all of which are behaviorally equivalent. For example, modules may be implemented as a software routine written in a computer language configured to be executed by a hardware machine (such as C, C++, Fortran, Java, Basic, Matlab or the like) or a modeling/simulation program such as Simulink, Stateflow, GNU Octave, or Lab VIEWMathScript. Additionally, it may be possible to implement modules using physical hardware that incorporates discrete or programmable analog, digital and/or quantum hardware. Examples of programmable hardware comprise: computers, microcontrollers, microprocessors, application-specific integrated circuits (ASICs); field programmable gate arrays (FPGAS); and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware with lesser functionality on a programmable device. Finally, it needs to be emphasized that the above mentioned technologies are often used in combination to achieve the result of a functional module.

The chosen exemplary embodiments of the claimed subject matter have been described and illustrated, to plan and/or cross section illustrations that are schematic illustrations of idealized embodiments, for practical purposes so as to enable any person skilled in the art to which it pertains to make and use the same. As such, variations from the shapes of the illustrations as a result, for example, of manufacturing techniques and/or tolerances, are to be expected. It: is therefore intended that all matters in the foregoing description and shown in the accompanying drawings be interpreted as illustrative and not in a limiting sense. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. It will be understood that variations, modifications, equivalents and substitutions for components of the specifically described exemplary embodiments of the invention may be made by those skilled in the art without departing from the spirit and scope of the invention as set forth in the appended claims.

When used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured function, and vice versa. Similarly, subject to perform that matter that is recited as being configured to perform a particular function may additionally or alternatively be described as being operative to perform that function.

It will be understood that when an element is referred to as being “on” another element, it can be directly on the other element or intervening elements may be present therebetween. In contrast, when an element is referred to as being “directly on” another element, there are no intervening elements present. As used herein, the term “and/or” includes any and all combinations of one or more of the associated listed items.

It will be understood that, although the terms “first,” “second,” “third” etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, “a first element,” “component,” “region,” “layer,” or “section” discussed below could be termed a second element, component, region, layer, or section without departing from the teachings herein.

Spatially relative terms, such as “beneath,” “below,” “lower,” “above,” “upper,” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the exemplary term “below” can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Unless otherwise stated, specific embodiments provide electronic device(s) or component(s) with modified characteristic(s) of the emitted electromagnetic energy without modification(s) to designed functionally or interface of the electronic device(s) or component(s). Similarly, unless otherwise stated specific embodiments provide methods to modified characteristic(s) of the emitted electromagnetic energy from an electronic device or component(s) without modification(s) to designed functionally or interface of such electronic device(s) or component(s).

Although the subject matter has been described in a combination with RF emissions, the disclosed embodiments will apply to devices emitting microwave emissions, millimeter wave emissions and terahertz wave emissions.

It should be appreciated that reference throughout this specification to “one embodiment” or “an embodiment” means that a particular feature, structure or characteristic described in connection with the embodiment is included in at least one embodiment of the present invention. Therefore, it is emphasized and should be appreciated that two or more references to “an embodiment” or “one embodiment” or “an alternative embodiment” in various portions of this specification are not necessarily all referring to the same embodiment or the same variation. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the independent claims following the detailed description are hereby expressly incorporated into this detailed description.

Any element in a claim that does not explicitly state “means for” performing a specified function, or “step for” performing a specified function, is not to be interpreted as a “means” or “step” clause as specified in 35 U.S.C. § 112, ¶ 6. In particular, any use of “step of” in the claims is not intended to invoke the provision of 35 U.S.C. § 112, ¶ 6.

Anywhere the term “comprising” is used, embodiments and components “consisting essentially of” and “consisting of” are expressly disclosed and described herein.”

Furthermore, the Abstract is not intended to be limiting as to the scope of the claimed invention and is for the purpose of quickly determining the nature of the claimed invention.

What is claimed is:

1. A method, comprising:

modifying a characteristic of an electromagnetic emission from an electrical device being a semiconductor device, the characteristic being internal to the electrical device, wherein modifying the characteristic includes connecting an antenna stub only to an interconnect between two circuit elements of the semiconductor device; and authenticating the electrical device in a response to a receipt of an electromagnetic emission with a modified characteristic.

2. The method of claim 1, wherein modifying the characteristic further comprises providing the antenna stub as a plurality of antenna stubs along a length of the interconnect between two circuit elements of the electrical device and connecting each antenna stub from the plurality of antenna stubs only to the interconnect.

3. The method of claim 1, wherein modifying the characteristic further comprises decreasing an impedance from the interconnect between the two circuit elements of the electrical device.

4. The method of claim 1, wherein modifying the characteristic further comprises adding a new interconnect between two circuit elements of the electrical device.

5. The method of claim 1, wherein modifying the characteristic further comprises modifying the characteristic without changing a designed interface functionality of the electrical device.

6. The method of claim 1, wherein modifying the characteristic further comprises narrowing or broadening a width of the interconnect between two circuit elements of the electrical device.

7. The method of claim 1, wherein modifying the characteristic further comprises modifying a frequency and an amplitude envelope of non-linear mixing products within the semiconductor device.

8. The method of claim 1, wherein the electrical device comprises a semiconductor device and wherein modifying the characteristic further comprises modifying a doping of a gate or a region within the semiconductor device.

9. The method of claim 1, wherein the electrical device comprises a semiconductor device and wherein modifying the characteristic further comprises changing a timing of a gate within the semiconductor device.

10. The method of claim 1, wherein the electrical device comprises a semiconductor device and wherein modifying the characteristic further comprises placing a conductive layer on a packaging of the semiconductor device, the conductive layer altering an amplitude or a frequency of the electromagnetic emission.

11. The method of claim 1, wherein the electrical device further comprises a semiconductor device and wherein modifying the characteristic comprises coupling a circuit element to an unused pin of the semiconductor device.

12. The method of claim 1, wherein the electrical device further comprises a semiconductor device and wherein modifying the characteristic comprises only connecting one end of an antenna stub to a bonding wire, the bonding wire coupling a lead within the semiconductor device to a die within the semiconductor device.

13. The method of claim 1, wherein the electrical device comprises a semiconductor device and wherein modifying the characteristic further comprises only connecting one end of another antenna stub to a lead between a die within the semiconductor device and an input or an output connection within a casing of the semiconductor device.

14. The method of claim 1, wherein authenticating the electrical device comprises:

powering the electrical device to emit the electromagnetic emission;

receiving, with a receiver, the electromagnetic emission; and confirming, with a control unit in a response to the receipt of the electromagnetic emission, a presence of the modified characteristic.

15. The method of claim 14, wherein powering the electrical device comprises connecting power and clock signals to the electrical device.

16. The method of claim 1, wherein modifying the characteristic further comprises increasing a width of a portion of the interconnect and connecting the antenna stub only to the portion with increased width.

17. The method of claim 1, wherein modifying the characteristic further comprises narrowing for broadening a width of the interconnect.

18. A method, comprising:

modifying a characteristic of an electromagnetic emission from an assembly of electronic devices mounted on a printed circuit board (PCB) by at least one of modifying an interconnect between two electronic devices from the assembly of electronic devices and only connecting one end of at least one antenna stub to the interconnect, wherein modifying the interconnect includes increasing a width of a portion of the interconnect and connecting the at least one antenna stub only to the portion with increased width; and authenticating at least one electronic device from the two electronic devices and the assembly in a response to a receipt of an electromagnetic emission with a modified characteristic.

19. The method of claim 18, further comprising terminating an opposite end of the at least one antenna stub without connecting the opposite end to any interconnect between other electronic devices.

20. The method of claim 18, wherein the at least one antenna stub comprises a plurality of antenna stubs being disposed along a length of the interconnect.

21. The method of claim 18, wherein modifying the characteristic further comprises decreasing an impedance from the interconnect.

22. The method of claim 18, wherein modifying the characteristic further comprises adding an additional interconnect between the two electronic devices.

23. A method, comprising:

modifying a characteristic of an electromagnetic emission from a semiconductor device, the characteristic being internal to the semiconductor device, wherein modifying the characteristic includes at least one of:

only connecting one end of an antenna stub to a bonding wire, the bonding wire coupling a lead within the semiconductor device to a die within the semiconductor device, and only connecting one end of another antenna stub to the lead between the die within the semiconductor device and an input or an output connection within a casing of the semiconductor device; and authenticating the semiconductor device in a response to a receipt of an electromagnetic emission with a modified characteristic.

24. A method, comprising:

modifying a characteristic of an electromagnetic emission from a semiconductor device, the characteristic being internal to the semiconductor device, wherein modifying the characteristic includes at least one of:

modifying a doping of a gate or a region within the semiconductor device, and changing a timing of a gate within the semiconductor device; and authenticating the semiconductor device in a response to a receipt of an electromagnetic emission with a modified characteristic.

* * * * *